(12) United States Patent
Ramadas et al.

(10) Patent No.: US 9,493,348 B2
(45) Date of Patent: Nov. 15, 2016

(54) NANOPARTICULATE ENCAPSULATION BARRIER STACK

(75) Inventors: Senthil Kumar Ramadas, Singapore (SG); Soo Jin Chua, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 641 days.

(21) Appl. No.: 12/513,569

(22) PCT Filed: Nov. 6, 2006

(86) PCT No.: PCT/SG2006/000334
§ 371 (c)(1),
(2), (4) Date: Dec. 18, 2009

(87) PCT Pub. No.: WO2008/057045
PCT Pub. Date: May 15, 2008

(65) Prior Publication Data
US 2010/0089636 A1    Apr. 15, 2010

(51) Int. Cl.
| | | |
|---|---|---|
| H01L 23/28 | (2006.01) | |
| H01L 23/48 | (2006.01) | |
| H01L 23/52 | (2006.01) | |
| H01L 29/40 | (2006.01) | |
| H01J 1/62 | (2006.01) | |
| H01J 63/04 | (2006.01) | |
| H01J 17/24 | (2012.01) | |
| H01J 19/70 | (2006.01) | |
| H01J 61/26 | (2006.01) | |

(Continued)

(52) U.S. Cl.
CPC .............. *B82Y 30/00* (2013.01); *B82Y 15/00* (2013.01); *B82Y 25/00* (2013.01); *H01L 51/5256* (2013.01); *H01L 51/5259* (2013.01); *H01L 2251/5369* (2013.01); *Y10T 428/25* (2015.01)

(58) Field of Classification Search
USPC ........................................ 174/521; 313/554
See application file for complete search history.

(56) References Cited

U.S. PATENT DOCUMENTS

| | | | |
|---|---|---|---|
| 3,510,371 A | 5/1970 | Frankson | |
| 4,260,768 A | 4/1981 | Lorenz et al. | |

(Continued)

FOREIGN PATENT DOCUMENTS

| | | |
|---|---|---|
| EP | 0776147 A1 | 5/1997 |
| EP | 1 164 644 A2 | 12/2001 |

(Continued)

OTHER PUBLICATIONS

Gole et al., "Unusual properties and reactivity at the nanoscale," Journal of Physics and Chemistry of Solids, 2005, 66:546-550.

(Continued)

*Primary Examiner* — Chau N Nguyen
*Assistant Examiner* — Roshn Varghese
(74) *Attorney, Agent, or Firm* — Blakely, Sokoloff, Taylor & Zafman LLP

(57) ABSTRACT

A barrier stack for encapsulating a moisture and/or oxygen sensitive electronic device is provided. The barrier stack comprises a multilayer film having at least one barrier layer having low moisture and/or oxygen permeability, and at least one sealing layer arranged to be in contact with a surface of the barrier layer, wherein the sealing material comprises reactive nanoparticles capable of interacting with moisture and/or oxygen, thereby retarding the permeation of moisture and/or oxygen through defects present in the barrier layer.

42 Claims, 9 Drawing Sheets

(51) Int. Cl.
| | | |
|---|---|---|
| *B82Y 30/00* | (2011.01) | |
| *B82Y 15/00* | (2011.01) | |
| *B82Y 25/00* | (2011.01) | |
| *H01L 51/52* | (2006.01) | |

(56) References Cited

U.S. PATENT DOCUMENTS

| | | | |
|---|---|---|---|
| 5,916,685 A | 6/1999 | Frisk | |
| 6,383,559 B1* | 5/2002 | Nakamura | B32B 7/02 428/308.4 |
| 6,465,953 B1 | 10/2002 | Duggal | |
| 6,466,355 B1 | 10/2002 | Berneth et al. | |
| 6,866,901 B2 | 3/2005 | Burrows et al. | |
| 7,261,647 B2 | 8/2007 | Sullivan et al. | |
| 7,531,234 B2* | 5/2009 | Nakamura et al. | 428/328 |
| 8,039,739 B1 | 10/2011 | Capps et al. | |
| 2003/0098648 A1* | 5/2003 | Miwa et al. | 313/506 |
| 2003/0170496 A1* | 9/2003 | Hieda et al. | 313/504 |
| 2003/0203210 A1 | 10/2003 | Graff et al. | |
| 2004/0075380 A1 | 4/2004 | Takemoto et al. | |
| 2004/0149759 A1 | 8/2004 | Moser et al. | |
| 2004/0245541 A1 | 12/2004 | Shitagaki et al. | |
| 2005/0051763 A1 | 3/2005 | Affinito et al. | |
| 2005/0110020 A1 | 5/2005 | Hayashi et al. | |
| 2005/0175831 A1 | 8/2005 | Kim et al. | |
| 2005/0218795 A1 | 10/2005 | Lee et al. | |
| 2005/0238804 A1 | 10/2005 | Garbar et al. | |
| 2005/0239294 A1 | 10/2005 | Rosenblum et al. | |
| 2005/0249901 A1 | 11/2005 | Yializis et al. | |
| 2005/0285521 A1* | 12/2005 | Menda | 313/512 |
| 2006/0001040 A1 | 1/2006 | Kim et al. | |
| 2006/0158111 A1 | 7/2006 | Hayashi | |
| 2006/0220549 A1 | 10/2006 | Kim et al. | |
| 2006/0232735 A1 | 10/2006 | Hokazono et al. | |
| 2007/0013292 A1 | 1/2007 | Inoue et al. | |
| 2007/0036510 A1* | 2/2007 | Ingman et al. | 385/147 |
| 2007/0099004 A1* | 5/2007 | Edelmann et al. | 428/447 |
| 2007/0182314 A1 | 8/2007 | Oh et al. | |
| 2007/0254107 A1* | 11/2007 | Rao et al. | 427/372.2 |
| 2010/0089636 A1 | 4/2010 | Ramadas et al. | |

FOREIGN PATENT DOCUMENTS

| | | |
|---|---|---|
| JP | 2002-056970 A | 2/2002 |
| JP | 2004-095503 A | 3/2004 |
| JP | 2005-259432 A | 9/2005 |
| JP | 2006-130717 A | 5/2006 |
| JP | 2006-172837 A | 6/2006 |
| JP | 2006-248138 A | 9/2006 |
| JP | 2007-523769 T | 8/2007 |
| JP | 2006-264118 A | 10/2008 |
| KR | 10-20040000010 A | 1/2004 |
| KR | 2004-0101595 A | 12/2004 |
| TW | 493359 B | 7/2002 |
| TW | 200420182 A | 10/2004 |
| WO | WO 2004/074003 A2 | 9/2004 |
| WO | WO 2005/005554 A2 | 1/2005 |
| WO | WO 2005/095924 A1 | 10/2005 |
| WO | WO 2006/057492 A1 | 6/2006 |
| WO | WO2006057492 | 6/2006 |
| WO | WO 2006/075317 A2 | 7/2006 |
| WO | WO2008057045 A1 | 5/2008 |
| WO | WO2008082362 A1 | 7/2008 |

OTHER PUBLICATIONS

Herrmann et al., "High-Performance Barrier Layers for Flexible CIGS Thin-Film Solar Cells on Metal Foils," Mat. Res. Soc. Symp. Proc., 2003, 763:B6.10.1-B6.10.6.

Koga et al,. "Formation of ordered ice nanotubes inside carbon nanotubes," Nature, Aug. 23, 2001, 412:802-805.
Swihart, Mark T., "Vapor-phase synthesis of nanoparticles," Current Opinion in Colloid and Interface Science, 2003, 8:127-133.
Supplementary European Search Report dated Mar. 3, 2011, in corresponding EP 06813114.3, 8 pages.
Japanese Patent Application No. P2009-535240 Notice of Reasons for Rejection issued by the Japanese Patent Office, mailed May 22, 2012, 7 pages. (English translation).
Taiwanese Patent Application No. 096141853 Office Action and Search Report issued by the Taiwan Intellectual Property Office on Apr. 30, 2012, 13 pages.
Koga, et al., "Formation of ordered ice nanotubes inside carbon nanotubes" Letters to Nature, vol. 412, Aug. 23, 2001, Macmillan Magazines Ltd., pp. 802-805.
Chen, Songping, "NanoGetters for MEMS Hermetic Packaging", "Proceedings of the 7$^{th}$ IEEE International Conference on Nano-technology, Hong Kong", Aug. 2-5, 2007, pp. 921-924.
Sommeling, P.M., et al., "Flexible Dye-Sensitized Nanocrystalling TiO2 Solar Cells", http://www.ecn.nl/docs/library/report/2000/rx00020.pdf, downloaded from Internet on Apr. 1, 2013, best available copy, 5 pages.
Chris Dearmitt, "Filled Thermoplastics", http://www.phantomplastics.com/attachments/File/Introduction_to_Filled_Thermoplics.pdf, 2009, 28 pages.
"Thermoplastic Polyurethane Elastomer Kuramiron", http://www.septon.info/en/about/kuramiron.pdf, 2010, 13 pages, Kuraray Co., Ltd., Tokyo, Japan.
Dec. 27, 2012 Office Action issued in corresponding Taiwan Patent Application No. 098111862.
Chen, Songping, "NanoGetters for MEMS Hermetic Packaging", "Proceedings of the 7¯th IEEE International Conference on Nano-technology, Hong Kong", Aug. 2-5, 2007, pp. 921-924.
Gole, James L., et al., "Unusual properties and reactivity at the nanoscale", "Journal of Physics and Chemistry of Solids", 2005, pp. 546-550, vol. 66.
Halme, Janne, "Dye-sensitized nanostructured and organic photovoltaic cells: technical review and preliminary tests", Master's thesis, Helsinki Institute of Technology, Dept. of Engr. Physics and Mathematics, Feb. 12, 2002.
Kodama, R., et al., "Fast heating of ultrahigh-density plasma as a step towards laser fusion ignition", "Nature", Aug. 23, 2001, pp. 798-802 and abstract, vol. 412.
Liu, Xinye et al., "Atomic Layer Deposition of Hafnium Oxide Thin Films From Tetrakis (dimethylamino) Hafnium (TDMAH) and Ozone", "D3.8.0, Mat. Res. Soc. Symp. Proc.", 2003, vol. 765, Publisher: Materials Research Society.
Wang, Zhong Lin et al., "Polyhedral Shapes of CeO2 Nanoparticles", "J. Phys. Chem. B.", 2003, pp. 13563-13566, vol. 107.
El-Sayed, Mostafa A., "Some Interesting Properties of Metals Confined in Time and Nanometer Space of Different Shapes", "Accounts of Chemical Research", 2001, pp. 257-264, vol. 34, No. 4.
EPO Communication enclosing Office Action for corresponding European Patent Application No. 06813114.3, 6 pages, (Oct. 16, 2013).
Office Action issued by the State Intellectual Property Office of P.R. China (SIPO) for corresponding Chinese Patent Application No. 200680056015.3, 5 pages, (Jan. 6, 2015).
Office Action issued by the European Patent Office (EPO) for corresponding European Patent Application No. 06813114.3, 8 pages, (Feb. 25, 2015).
Nanophase Technologies Corporation, "Nanoparticle Production Technology", retrieved from the Internet: http://nanophase.com/technology/nanoparticle-production-technology/, 2 pp., (2016).
Alfa Aesar—A Johnson Matthey Company, "Nanoparticles and Dispersions—Exploring the Possibilities", retrieved from the Internet: https://www.alfa.com/media/docs/Nanoparticles.pdf, 8 pp.

\* cited by examiner

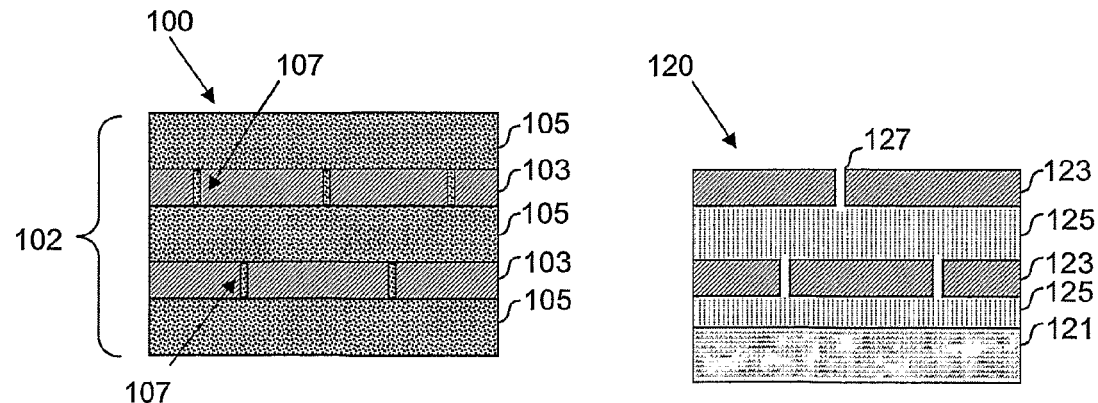
FIG. 1A
FIG. 1B (prior art)
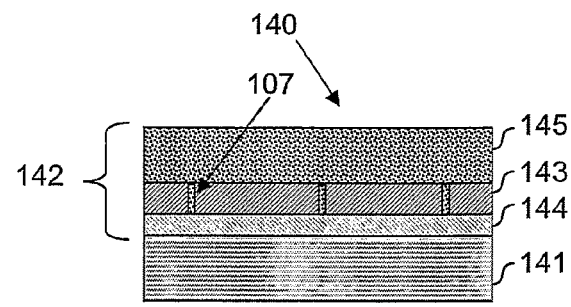
FIG. 1C
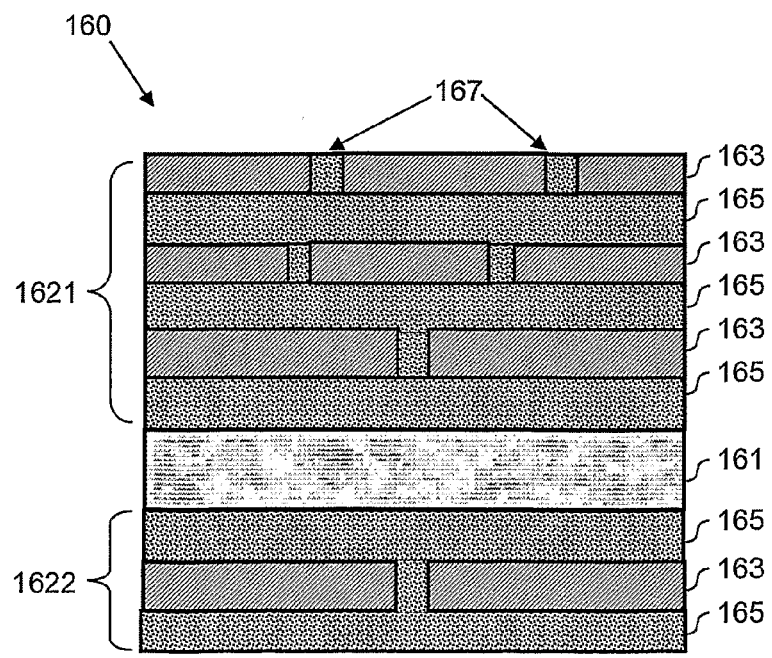
FIG. 1D

Process Sequence:

Stack F      Stack E      Stack D

NANOPARTICULATE ENCAPSULATION BARRIER STACK

CROSS-REFERENCE TO RELATED APPLICATIONS

This application is a National Stage application of PCT/SG2006/000334, filed Nov. 6, 2006.

The present invention relates generally to the field of encapsulation barrier stacks, and more particularly to encapsulation barrier stacks comprising reactive nanoparticles.

BACKGROUND OF THE INVENTION

Organic Light Emitting Displays (OLEDs) are widely seen as the next generation display technology that will come to replace existing display technology. Amongst the various challenges to be dealt with in the development of OLEDS, effective encapsulation remains one of the most significant.

One commonly known problem with OLED structures and other oxygen and/or moisture sensitive electroluminescent devices is that they degrade rapidly under atmospheric conditions. In order to protect them from degradation, various types of encapsulation have been used to isolate the electroluminescent devices from the environment. It is estimated that for an OLED to achieve reliable performance with a lifetime exceeding 10,000 hours, the encapsulation around the reactive electroluminescent material should have an oxygen transmission rate (OTR) less than about 5 to 10 $cc/m^2/day$ and a water vapor transmission rate (WVTR) of less than about $10^{-5}$ $g/m^2/day$ at 39° C. and 95% RH. The technical challenges brought about by these stringent requirements have driven constant developments in encapsulation technology over the years.

Conventional encapsulation structures comprise a substrate on which the electroluminescent device is formed, and a covering structure which seals the electroluminescent device against the substrate. In certain types of electronics applications, such as hard disk drives, one approach in improving the barrier properties of an encapsulation is to utilise thick, gas impermeable encapsulation structures. However, this approach is not suitable for applications such as OLEDs or solar cells in which opacity is a requirement and the quality of light transmitted through the encapsulation must be maintained.

Recent developments in OLED technology has seen the rise of flexible OLEDs which require that the encapsulation structures are flexible, thereby making it more apparent that encapsulation technology has not kept pace with developments in OLED technology. The substrate for a flexible OLED should ideally combine the gas barrier properties, chemical resistance and surface properties of glass with the flexibility, toughness and processability of conventional plastics. Transparent polymers were used to form various parts of an encapsulation structure because they were inexpensive and easily processed. However, due to their permeability to moisture and oxygen, encapsulation structures formed from polymers alone are nowadays considered to be inadequate for achieving low permeation rates as the required standard for oxygen and water vapor impermeability are orders of magnitude lower than what is achievable with the best polymer substrates using today's state of the art in industrial polymer technology.

More recently, barrier laminates derived from certain types of inorganic materials were found to have better barrier properties than polymeric barrier laminates. Metals such as aluminium are now used as barrier materials (e.g. aluminium foils) for packaging food substances and pharmaceutical drugs. Despite possessing improved barrier properties, it has been found that the performance of inorganic barrier laminates is still limited by inherent structural defects. Recent studies have shown that structural defects such as pinholes, cracks, grain boundaries, etc., allows oxygen and moisture to permeate over time, leading to poorer than expected barrier performance. It is difficult to control fabrication to such an extent that defects are completely eradicated because such defects are randomly formed, independent of the method of fabrication.

One approach that has been used to overcome the problems of poor barrier properties in polymer barrier stacks and the problems in forming defect-free inorganic barrier layers is to stack multiple polymer/metal oxide layers together to form a barrier stack. It has been found that combining polymer layers with metal oxide layers enables the defects of one polymer/barrier oxide stack to be decoupled from the next polymer/barrier oxide stack, thereby slowing down the propagation of oxygen/moisture from one inorganic layer to the next.

Vitex Inc. discloses in U.S. Pat. No. 6,866,901 a multi-layer barrier stacks comprising multiple sputter-deposited aluminium oxide inorganic layers separated by polymer multilayers (PML) comprising organic polymers. This multi-layer barrier stack design is based on the principle of decoupling the defects of two successive barrier oxide layers in the multilayer barrier stack. A recent modelling study suggests that defect decoupling due to the organic/inorganic multilayers forces a tortuous path for moisture and oxygen diffusion, thus reducing the permeation rate by several orders of magnitude.

Despite this development, a large number of thick barrier oxide and polymer interlayers are needed in order to achieve ultra high barrier properties of better than $10^{-6}$ $g/m^2/day$, or even better levels of $10^{-6}$ $g/m^2/day$. Variations in overall barrier performance still arise due to factors such as whether the pinholes in one layer are lined up with the defects in the other layers. Other limitations of the multilayer stack approach is that it suffers from poor adhesion and frequent delamination occurs, especially during the thermal cycles of the OLED fabrication processes, since the inorganic and organic layers have sharp interfaces with weak bonding structure due to nature of the sputter deposition and PML formation processes. It also results in thick panels with poor transmission qualities and which cracks easily.

HELICON Research, Inc. discloses in US Patent Application No. 2005/0051763 an organic/inorganic nanocomposite structure formed by infiltration of a porous inorganic layer by an organic material. The composite structure is produced by vacuum deposition techniques. In contrast with the aforementioned techniques, this document teaches the fabrication of porous inorganic barrier layer onto plastic substrate and then depositing organic material in the barrier layer such that it infiltrates the porous inorganic material to form a continuous layer.

General Electric Inc. discloses in EP 1 164 644 a barrier system which utilizes the high temperature resistance and high clarity of transparent Lexan™ film properties to enable a 125-micron-thick substrate to withstand the heat involved in OLED fabrication and to allow optimal light transmission from the device. The barrier coating comprises silicon oxide compounds which are applied onto the substrate using plasma enhanced chemical vapour deposition. The barrier coating prevents degradation of the device from oxygen, moisture, chemicals, and electronic conductivity while promoting light transmission. Additionally, nanoparticles reactive with moisture are incorporated into the base substrate.

Nanocomposite barrier materials comprising mineral clay nanoparticles distributed in a polymeric binder have been developed for use in food packaging materials. For example, U.S. Pat. No. 5,916,685 discloses a multilayer barrier laminate comprising an exterior polymeric layer containing non-reactive clay nanoparticles in the quantity of about 0.1 to 10% by weight of a polymer layer in which it is distributed. The polymer layer is arranged on an inner metal oxide barrier layer. The barrier laminate achieves a water vapour transmission rate of about 0.61 g/m$^2$/day over a 24 hr period, and is clearly unsuitable for OLED encapsulation.

Accordingly, limitations in the barrier performance of existing encapsulation structures still exists. An object of the present invention is to provide an alternative barrier stack that has improved barrier properties and is inexpensively fabricated.

SUMMARY OF THE INVENTION

According to a first aspect of the present invention, an encapsulation barrier stack capable of encapsulating a moisture and/or oxygen sensitive article is provided, comprising:

a multilayer film having at least one barrier layer having low moisture and/or oxygen permeability, and at least one sealing layer arranged to be in contact with a surface of the at least one barrier layer, thereby covering defects present in the barrier layer, wherein the at least one sealing layer comprises reactive nanoparticles capable of interacting with moisture and/or oxygen to retard the permeation of moisture and/or oxygen through the defects present in the barrier layer.

According to another aspect of the invention, an electronic device comprising a moisture and/or oxygen sensitive reactive component is provided in which said reactive component is arranged within an encapsulation barrier stack according to the first aspect of the invention.

The invention is also directed to a method for the manufacture of an encapsulation barrier stack according to the first aspect of the invention, comprising:

forming at least one barrier layer and at least one sealing layer in alternating sequence, wherein forming the at least one sealing layer comprises mixing a polymerisable compound with a nanoparticle dispersion to form a sealing mixture, and polymerising the sealing mixture over the at least one barrier layer under vacuum.

The present invention is based on the finding that coupling a sealing layer which comprises reactive nanoparticles to an inorganic barrier layer can effectively reduce the rate at which moisture or oxygen permeates the barrier layer. Rather than seeking to improve existing barrier layer fabrication methods, the present invention utilises reactive nanoparticles that either adsorbs or chemically react with moisture and/or oxygen to plug the defects present in the barrier layer. This approach of dealing with the problem of defects typically present in metal oxide barrier layers can be implemented inexpensively given that it can be integrated with existing processes. Apart from the improvement in barrier properties, the inventors have also found that the use of sealing layers containing nanoparticles result in improved lamination between barrier layers due to the high surface roughness provided by the nanoparticles. For stringent applications, a plurality of barrier films with intervening polymeric interlayers containing reactive nanoparticles may be used to achieve a high level of gas impermeability. This solution to the problem of defects in inorganic barrier films is supported by two-dimensional finite element modelling, which has shown that a key requirement for achieving ultra high barrier performance is that the organic defect decoupling layer thickness is smaller than the typical offset distance between the defects in barrier layers.

In accordance with the above findings, the encapsulation barrier stack of the invention comprises a multilayer film having at least one barrier layer with low gas permeability, and at least one sealing layer arranged to be in contact with a surface of the barrier layer. The sealing layer comprises reactive nanoparticles that can interact with moisture and/or oxygen, thereby retarding their permeation through the barrier stack via defects present in the barrier layer.

"Defects" in the barrier layer refer to structural defects, such as pits, pinholes, microcracks and grain boundary. Such structural defects are known to exist in all types of barrier layers that are fabricated from deposition processes from which barrier layers are typically produced, such as chemical vapour deposition, as well as roll-to-roll processes. Gases can permeate these defects, thereby leading to poor barrier properties (see Mat. Res. Soc. Symp. Proc. Vol. 763, 2003, B6.10.1-B610.6).

"Reactive" nanoparticles refer to nanoparticles capable of interacting with moisture and/or oxygen, either by way of chemical reaction (e.g. hydrolysis or oxidation), or through physical or physico-chemical interaction (e.g. capillary action, adsorption, hydrophilic attraction, or any other non-covalent interaction between the nanoparticles and water/oxygen). Reactive nanoparticles may comprise or consist of metals which are reactive towards water and/or oxygen, i.e. metals which are above hydrogen in the reactivity series, including metals from Group 2 to 14 (IUPAC) may be used. Some preferred metals include those from Groups 2, 4, 10, 12, 13 and 14. For example, these metals may be selected from Al, Mg, Ba and Ca. Reactive transition metals may also be used, including Ti, Zn, Sn, Ni, and Fe for instance.

Other than metals, reactive nanoparticles may also include or consist of certain metal oxides which are capable of interacting with moisture and/or oxygen may also be used, including $TiO_2$, $Al_2O_3$, $ZrO_2$, $ZnO$, $BaO$, $SrO$, $CaO$ and $MgO$, $VO_2$, $CrO_2$, $MoO_2$, and $LiMn_2O_4$. In certain embodiments, the metal oxide may comprise a transparent conductive metal oxide selected from the group consisting of cadmium stannate ($Cd_2SnO_4$), cadmium indate ($CdIn_2O_4$), zinc stannate ($Zn_2SnO_4$ and $ZnSnO_3$), and zinc indium oxide ($Zn_2In_2O_5$).

In this conjunction, it is evident for a person skilled in the art that reactivity may depend on the size of the used material (see J. Phys. Chem. Solids 66 (2005) 546-550). For example, $Al_2O_3$ and $TiO_2$ are reactive towards moisture in the form of nanoparticles but are unreactive (or reactive only to a very small extent) in the (continuous) bulk phase, such as a microscale or millimeter scale barrier layer which is beyond the nanoscale dimension of several nanometers to several hundred nanometers typically associated with nanoparticles. Accordingly, using $Al_2O_3$ and $TiO_2$ as illustrative examples, $Al_2O_3$ and $TiO_2$ nanoparticles are considered to be reactive towards moisture, whereas $Al_2O_3$ and $TiO_2$ bulk layers are passive barrier layers having low reactivity towards moisture. In general, reactive metal or metal oxide nanoparticles, for example $Al_2O_3$, $TiO_2$ or $ZnO$ nanoparticles, may be present in suitable colloidal dispersions for the preservation of reactivity and may be synthesised via any conventional or proprietary method such as the NanoArc® method from Nanophase Technologies Corporation.

Apart from metals and metal oxides, reactive nanoparticles in the sealing layer may also comprise or consist of carbon nanoparticles, such as carbon nanotubes, nanoribbons, nanofibres and any regular or irregular shaped carbon particles with nanoscale dimensions. For carbon nanotubes, single-walled or multi-walled carbon nanotubes may be used. In a study carried out by the present inventors, it was found that carbon nanotubes (CNTs) can serve as a desiccant. Carbon nanotubes can be wetted by low surface tension liquids via capillary action, particularly liquids whose surface tension does not exceed about 200 Nm<"1> (Nature, page 802, Vol. 412, 2001). In principle, this would mean that water molecules can be drawn into open-ended carbon nanotubes by capillary suction. It is suggested that water molecules may form quasi-one-dimensional structures within carbon nanotubes, thereby helping to absorb and retain a small volume of oxygen and water molecules. While the quantity of carbon nanotubes may be maximised for maximum moisture and/or oxygen absorption, the inventors have found that in practice lower amounts are also suitable. For example, carbon nanotubes may be used in low quantities of about 0.01% to 10% by weight of the nanoparticles present. Higher concentrations of carbon nanotubes may also be used, but with a corresponding decrease in the transparency of the encapsulation barrier stack.

In one embodiment, inert nanoparticles are included in the sealing layer and used in conjunction with reactive nanoparticles. As used herein, "inert nanoparticles" refer to nanoparticles which do not interact at all with moisture and/or oxygen, or which react to a small extent as compared to reactive nanoparticles. Such nanoparticles may be included into the sealing layer to obstruct the permeation of oxygen and/or moisture through the sealing layer. Examples of inert particles include nanoclays as described in U.S. Pat. No. 5,916,685. Such nanoparticles serve to plug the defects in the barrier layer, thereby obstructing the path through which permeation takes place, or at least reducing the defect cross-sectional area, thus rendering permeation pathways by which water vapour or oxygen diffuses through the defect much more tortuous, thus leading to longer permeation time before the barrier layer is breached and thereby improving barrier properties.

Other suitable materials for inert nanoparticles may also include unreactive metals such as copper, platinum, gold and silver; minerals or clays such as silica, wollastonite, mullite, monmorillonite; rare earth elements, silicate glass, fluorosilicate glass, fluoroborosilicate glass, aluminosilicate glass, calcium silicate glass, calcium aluminum silicate glass, calcium aluminum fluorosilicate glass, titanium carbide, zirconium carbide, zirconium nitride, silicon carbide, or silicon nitride, metal sulfides, and a mixture or combination thereof. Encapsulation barrier stacks which comprise sealing layers having only inert nanoparticles, such as nanoclay particles, do not belong to the invention.

Without wishing to be bound by theory, the inventors believe that strong barrier properties can be achieved by using a combination of different types of nanoparticles. By studying the absorption/reaction characteristics of different types of nanoparticles, it is possible to select a combination of nanoparticles which compliment each other to achieve stronger barrier effects than with a single type of material. For example, different types of reactive nanoparticles may be used in the sealing layer, or a combination of reactive and inert nanoparticles may be used.

In accordance with the above, the sealing layer may comprise a combination of carbon nanotubes and metal and/or metal oxide nanoparticles. One exemplary embodiment would be the combination of $TiO_2/Al_2O_3$ nanoparticles with carbon nanotubes. Any range of quantitative ratios may be used and optimised accordingly using regular experimentation. In an exemplary embodiment, the quantity of metal oxide nanoparticles present is between 500 to 15000 times (by weight) the quantity of carbon nanotubes. For oxides of metals having low atomic weight, lower ratios can be used. For example, $TiO_2$ nanoparticles can be used in combination with carbon nanotubes, with the weight ratio of carbon nanotubes to $TiO_2$ being between about 1:10 to about 1:5, but not limited thereto.

The encapsulation barrier stack of the invention may be used to encapsulate any type of moisture and/or oxygen sensitive article, such as electronic devices, drugs, foods, and reactive materials, for example. For encapsulating electroluminescent devices, the quality of light transmitted through the encapsulation barrier stack is particularly important. Thus, when the encapsulation barrier stack is used as a cover substrate over a top-emitting OLED, or when the encapsulation layer is designed for TOLED or see-through displays, the encapsulation barrier stack should not cause the quality of light transmitted by the electroluminescent device to be substantially degraded.

Based on the above requirement, the size of the particles may be chosen in such a way that optical transparency is maintained. In one embodiment, the sealing layer comprises nanoparticles having an average size of less than ½, or more preferably less than ⅕, the characteristic wavelength of light produced by the electroluminescent electronic component. In this context, the characteristic wavelength is defined as the wavelength at which the peak intensity of the light spectrum that is produced by the electroluminescent device. For electroluminescent devices emitting visible light, this design requirement translates into nanoparticles having a dimension of less than about 350 nm, or more preferably less than 200 nm.

As the random packing density of nanoparticles in the defects of the barrier layer is determined by the shape and size distribution of the nanoparticles, it is advantageous to use nanoparticles of different shapes and sizes to precisely control the sealing of defects of the barrier oxide layer. The nanoparticles may be present in one uniform shape or it may be formed in two or more shapes. Possible shapes that the nanoparticles can assume include spherical shapes, rod shapes, elliptical shapes or any irregular shapes. In the case of rod shaped nanoparticles, they may have a diameter of between about 10 nm to 50 nm, a length of 50 to 400 nm, and an aspect ratio of more than 5, but not limited thereto.

In order to provide efficient interaction between the reactive nanoparticles and the water vapour/oxygen permeating the barrier layer, the nanoparticles occupying the defects may have suitable shapes that would maximise the surface area that can come into contact with the water vapour and oxygen. This means that the nanoparticles may be designed to have a large surface area to volume, or surface area to weight ratio. In one embodiment, the nanoparticles have a surface area to weight ratio of between about 1 $m^2$/g to about 200 $m^2$/g. This requirement can be achieved by using nanoparticles with different shapes, such as 2, 3 or more different shapes as described above.

A binder in which the nanoparticles are distributed may be used in the sealing layer. Materials suitable for use as the binder include polymers, such as polymers derivable from monomers having at least one polymerisable group, and which can be readily polymerised. Examples of polymeric materials suitable for this purpose include polyacrylate, polyacrylamide, polyepoxide, parylene, polysiloxanes and polyurethane or any other polymer. For strong adhesion between 2 successive barrier layers, or to adhere the multilayer film onto a substrate, the polymers with good adhesive quality may be chosen. The sealing layer containing the nanoparticles is typically formed by coating the barrier with a dispersion containing nanoparticles mixed with a monomer solution, e.g. an unsaturated organic compound having at least one polymerisable group. Thickness of the sealing layer comprising binder with distributed nanoparticles therein can be in the range of about 2 nm to about several micrometers.

In some embodiments, the sealing layer is arranged to be in close proximate contact with the entire surface of the barrier layer. For example, the sealing layer may be formed over the barrier layer in such a manner that it conforms to the shape of defects present on the surface of the barrier layer, i.e. either occupying or filling up entirely the pits present in the at least one barrier layer, or levelling rough protrusions over the surface of the barrier layer. In this manner, defects giving rise to the permeation of corrosive gases through the encapsulation barrier stack are "plugged", while protrusions which would otherwise give rise to poor interfacial contact between barrier layers are levelled. Any conformal coating or deposition method can be used, e.g. chemical vapour deposition or spin coating. Atomic layer deposition and pulsed laser deposition may also be used to form the sealing layer.

The barrier material used for forming the barrier layer of the multilayer film may comprise any typical barrier material with low permeability to water vapour and/or oxygen in the bulk phase. For example, the barrier material may comprise metals, metal oxides, ceramics, inorganic polymers, organic polymers and combinations thereof. In one embodiment, the barrier material is selected from indium tin oxide (ITO), TiAlN, $SiO_2$, SiC, $Si_3N_4$, $TiO_2$, $HfO_2$, $Y_2O_3$, $Ta_2O_4$, and $Al_2O_3$. The thickness of a barrier layer may be between 20 nm to 80 nm. In this respect, materials for reactive nanoparticles can be used as the barrier layer since the reactivity of the material depends on its size. For example, although nanoparticulate $Al_2O_3$ is reactive towards water, a bulk layer of $Al_2O_3$ which has larger than nanoscale dimensions does not display the same level of reactivity with water, and can thus be used for the barrier layer.

For certain applications which require the encapsulation barrier stack to have good mechanical strength, a substrate may be provided to support the multilayer film. The substrate may be flexible or rigid. The substrate may comprise any suitable variety of materials such as polyacetate, polypropylene, polyimide, cellophane, poly(1-trimethylsilyl-1-propyne, poly(4-methyl-2-pentyne), polyimide, polycarbonate, polyethylene, polyethersulfone, epoxy resins, polyethylene terepthalate, polystyrene, polyurethane, polyacrylate, polyacrylamide, polydimethylphenylene oxide, styrene-divinylbenzene copolymers, polyvinylidene fluoride (PVDF), nylon, nitrocellulose, cellulose, glass, indium tin oxide, nano-clays, silicones, polydimethylsiloxanes, biscyclopentadienyl iron, or polyphosphazenes, to name some illustrative examples. The base substrate may arranged to face the external environment and or it may face the encapsulated environment. In food packaging, the substrate may face the internal surface that is in contact with food while the encapsulation barrier stack forms the external surface in contact with atmospheric conditions.

Although it may be possible to form the multilayer film directly onto a substrate, a substrate with a rough surface may be undesirable for direct contact with the barrier layer of the multilayer film. An interface layer between the multilayer film and the substrate may be provided to improve the contact between them. In one embodiment, a planarising layer is interposed between the substrate and the multilayer film so that the interface between the substrate and the multilayer film is improved. The planarising layer may comprise any suitable type of polymeric adhesive material such as epoxy. In a preferred embodiment, the planarising layer comprises polyacrylate (acrylic polymer), as polyacrylate is known for having strong water absorption properties. In the absence of a planarising layer, the multilayer film may be orientated such that the sealing layer is in contact with the surface of the substrate, for example.

The barrier effect of a single barrier layer coupled with a sealing layer, i.e. a single 'paired layer', is additive, meaning that the number of pairs of barrier/sealing layers coupled together is proportional to the overall barrier property of the multilayer film. Accordingly, for applications requiring high barrier properties, a plurality of paired layers may be used. In one embodiment, each barrier layer is stacked on top of each sealing layer in alternating sequence. In other words, each sealing layer acts as an interface layer between 2 barrier layers. In some embodiments, 1, 2, 3, 4, or 5 paired layers are present in the multilayer film. For general purpose applications in which water vapour and oxygen permeation rates are less stringent (e.g. less than $10^{-3}$ g/m$^2$/day), the multilayer film may include only 1 or 2 barrier layers (1, 2 or 3 sealing layers would correspondingly be present), whereas for more stringent applications, 3, 4, 5 or more barrier layers may be included in the multilayer film to achieve water vapour permeation rates of less than $10^{-5}$ g/m$^2$/day or preferably less than $10^{-6}$ g/m$^2$/day. Where more than 2 paired layers are used, each paired layer may be formed on opposing sides of the substrate to provide a double-laminated substrate, or they be formed on the same side of the substrate.

In order to protect the multilayer film from mechanical damage, the multilayer film may be capped or overlaid with a terminal protective layer. The terminal layer may comprise any material having good mechanical strength and is scratch resistant. In one embodiment, the terminal layer comprises an acrylic film having distributed therein LIE and/or $MgF_2$ particles.

The encapsulation barrier stack according to the invention may be used for any suitable barrier application, such as in the construction of a casing or housing, or a barrier foil for blister packs, or it may be used as an encapsulating layer over an electronic component. The encapsulation barrier stack may also be laminated over any existing barrier material, such as packaging materials for food and drinks, to improve their existing barrier properties. In a preferred embodiment, the encapsulation barrier stack is used to form an encapsulation for protecting electroluminescent electronic components comprising moisture and/or oxygen sensitive reactive layers, wherein the electroluminescent component is encapsulated within the encapsulation. Examples of such devices include, but are not limited to, reactive components comprised in Organic Light Emitting Devices (OLEDs), charged-coupled devices (CODs), and micro-electro-mechanical sensors (MEMS).

In OLED applications, the encapsulation barrier stack may be used to form any part of an encapsulation for isolating the active component of the OLED device. In one embodiment, the encapsulation barrier stack is used to form a base substrate for supporting the reactive layers of the electroluminescent component. In a rim-sealing structure, the encapsulation barrier stack may be used to form a rigid cover that is arranged over the reactive layers of the electroluminescent component. The rigid cover may be attached to the base substrate by means of an adhesive layer, the adhesive layer being arranged at least substantially along the edge of the cover substrate for forming an enclosure around the reactive component. In order to minimise lateral diffusion of oxygen/moisture into the enclosure containing the reactive component, the width of the covering layer or the adhesive layer may be made larger than the thickness of the encapsulation barrier stack.

In another embodiment, the encapsulation barrier stack is used to form a flexible encapsulating layer which seals the electroluminescent component against the base substrate. In this case, such an encapsulating layer may wrap around the surface of the electroluminescent component to form a 'proximal encapsulation'. The shape of the encapsulating layer thus conforms to the shape of the reactive component, leaving no gap between the electroluminescent component to be encapsulated and the encapsulating layer.

The present invention is further directed to a method of forming an encapsulation barrier stack according to the invention. The method comprises forming at least one barrier layer and at least one sealing layer. As the sealing layer contains reactive nanoparticles, steps involving the preparation and the use of the sealing layer is preferably carried out under vacuum to preserve the reactivity of the nanoparticles towards the moisture and/or oxygen. The step of forming the sealing layer comprises mixing a polymerisable compound with a nanoparticle dispersion to form a sealing mixture, and polymerising the sealing mixture under vacuum to form a sealing layer. The nanoparticle dispersion may comprise nanoparticles dispersed in at least one organic solvent. The at least one organic solvent may include any suitable solvent, such as ethers, ketones, aldehydes and glycols for example.

Nanoparticles may be synthesised by any conventional method known in the art, including vapor phase synthesis (Swihart, Current Opinion in Colloid and Interface Science 8 (2003) 127-133), sol-gel processing, sonochemical processing, cavitation processing, microemulsion processing, and high-energy ball milling, for instance. Nanoparticles are also commercially available either as nanoparticle powders or in a ready-made dispersion from Nanophase Technologies Corporation, for example. Proprietary methods may be used to synthesise commercially obtained nanoparticles such as NanoArc® synthesis.

In one embodiment, surface-activation of the nanoparticles is carried out in order to remove contaminants from the surface of the nanoparticles that may interfere with their ability to react with moisture and/or oxygen. Surface activation may comprise treating the nanoparticles with an acid, including mineral acids such as hydrochloric acid or sulphuric acid. The acid used for said treatment is preferably a dilute acid. Treatment comprises immersing the nanoparticles in the acid for a period of about 1 hour. It is to be noted that nanoparticles which can be easily contaminated such as carbon nanotubes and carbon nanofibres may require surface activation. On the other hand, nanoparticles such as aluminium oxide and titanium oxide may not require surface activation since these nanoparticles have high surface energy.

The polymerisable compound may be any readily polymerisable monomer. Suitable monomers are preferably readily polymerisable via UV curing or heat curing or any other convenient curing method.

In one embodiment, polyacrylamide is used as polymer for binding the nanoparticles. Acrylic acid monomer powder may be dissolved in polar organic solvents such as 2-methoxyethanol (2MOE) and ethylene glycol (EG). In order to obtain a uniform distribution of the nanoparticles in the sealing mixture, sonification of the sealing mixture may additionally be carried out. For instance, sonification may be carried out for at least about 30 minutes prior to polymerisation.

A substrate may be a part of the device to be encapsulated, such as a part of a circuit board, or it may be an additional structure that is included as part of the encapsulation, such as a flexible substrate. It is also possible that the substrate is part of the encapsulation barrier stack, comprising a thick barrier layer on which further sealing layers and barrier layers are subsequently deposited. Otherwise, the substrate may be the surface of a worktop for fabricating the multilayer film and as such does not form part of the encapsulation barrier stack.

Once the substrate has been provided, it can be coated with barrier layers and the sealing solution. The barrier layer can be formed via physical vapor deposition (e.g. magnetron sputtering, thermal evaporation or electron beam evaporation), plasma polymerization, CVD, printing, spinning or any conventional coating processes including tip or dip coating processes.

The sealing solution may be formed on the barrier layer via any solgel method such as spin coating, screen printing, WebFlight method, tip coating, CVD methods or any other conventional coating methods. Metal oxide and metal nanoparticles, as well as carbon nanotubes, can be co-evaporated along with monomer or dimers of parylene based polymer films. Any type of parylene dimers including parylene C or D or any other grades can be evaporated along with nano particles.

If multiple barrier/sealing layers, i.e. paired layers, are to be formed, a substrate can be repetitively coated with the barrier material and sealing solution in. In order to establish an alternating arrangement comprising successive barrier layer and sealing layer, the substrate may be successively coated first with the barrier material and then the sealing solution repeating over several times until the intended number of layers are formed. Each time the sealing solution is applied, it is preferably UV cured prior to the formation of the next barrier layer over it.

After the sealing and barrier layers have been formed, optional steps may be taken to complete the construction of the encapsulation barrier stack, such as the formation of a glass cover, ITO lines and ITO coating. For example, Passive Matrix displays may require ITO lines to be formed on the encapsulation barrier stack. After the cover has been formed, the exposed surface of the cover may be further protected with a protective coating via deposition of a capping layer (MgF/LiF coating).

These aspects of the invention will be more fully understood in view of the following description, drawings and non-limiting examples.

BRIEF DESCRIPTION OF THE DRAWINGS

Illustrative embodiments will now be described by way of non-limiting examples only, with reference to the accompanying drawings, in which:

FIG. 1A depicts an encapsulation barrier stack according to one embodiment of the invention. FIG. 1B depicts a conventional barrier stack. FIGS. 1C and 1D depicts other embodiments of the encapsulation barrier stack which comprise a base substrate.

DETAILED DESCRIPTION

Figure 2A:
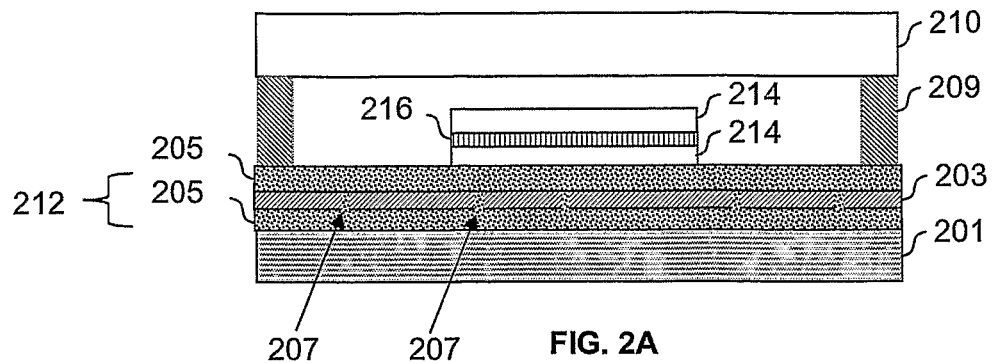
FIG. 2A, FIG. 2B and FIG. 2C depict various implementations of the encapsulation barrier stack for encapsulating an OLED device.

FIG. 1A shows one embodiment of an encapsulation barrier stack 100 according to the invention. The encapsulation barrier stack 100 comprises a multilayer film 102 comprising barrier layers 103 and sealing layers 105. The barrier layers 103 have low permeability to oxygen and/or moisture. It will be noted that barrier layers 103 contain pinhole defects 107 which extend through the thickness of the barrier layer 103. Pinhole defects along with other types of structural defects limit the barrier performance of barrier layers as oxygen and water vapour can permeate into the barrier layer via these defects, eventually traversing the encapsulation barrier stack and coming into contact with the oxygen/moisture sensitive device. For illustrative purposes, FIG. 1A depicts only pinhole defects. In reality, other types of structural defects such as pits and cracks may also be present.

The sealing layers 105 comprise reactive nanoparticles capable of interacting with water vapour and/or oxygen, thereby retarding the permeation of oxygen/moisture through the encapsulation barrier stack. In accordance with the present invention, these defects are at least partially covered up, or in some embodiments, entirely filled up by the nanoparticles in the sealing layer 105.

FIG. 1B depicts a conventional barrier stack 120 which comprises barrier layers 123 and planarising adhesive layers 125 are arranged on a substrate 121. Although inorganic metal oxide barrier layers have relatively high gas impermeability, pinhole defects present in the barrier layer allow moisture and oxygen to permeate through the barrier layer. In the figure, pinhole defects 127 in the barrier layers 123 are exposed to the environment, so moisture and oxygen are able to permeate through the barrier layer. For example, oxygen and moisture can permeate through the barrier layer 1231 via pinhole defects, and then progressively permeate through the adhesive layer 1251, and subsequently permeate through barrier layer 1232 and adhesive layer 1252 to reach the substrate 121 where an oxygen/moisture sensitive device is typically located.

FIG. 1C depicts yet another embodiment of a barrier stack 140 according to the invention wherein the multilayer film 142 comprises one barrier layer 143 and only one sealing layer 145 arranged over it. The barrier stack 140 further comprises a base substrate 141 for supporting the multilayer film. A planarising layer 144 is interposed between the base substrate 141 and the multilayer film 142 included to improve the contact between the multilayer film and the substrate. A single paired layer in accordance with this embodiment can be used for applications with less stringent barrier requirements.

The foregoing embodiments show an encapsulation barrier stack in which the multilayer film is laminated onto only one side of a substrate. FIG. 1D shows a double-laminated substrate in which a multilayer film is laminated to both sides of a base substrate. Encapsulation barrier stack 160 comprises a substrate 161 that is sandwiched between two multilayer films 1621 and 1622. Multilayer film 1621 comprises 3 barrier layers 163 and three nanoparticulate sealing layers 165. Multilayer film 1622 comprises 1 barrier layer and 2 sealing layers. Each respective layer is arranged in alternating sequence such that the sealing layers form the interlayer between any 2 barrier layers. In this embodiment, sealing layers 165 are in direct contact with the substrate 161, thereby serving as planarising layers. By forming 5 paired layers on the substrate, this embodiment provides an encapsulation barrier stack with high gas barrier properties.

The encapsulation barrier stack of the invention can be used in several ways for encapsulating a moisture and oxygen sensitive device such as an OLED. For example, it can be laminated onto a conventional polymer substrate that is used to support the OLED. FIG. 2A shows an encapsulated OLED comprising electrodes 214 and reactive layer 216 within a rim-sealed encapsulation. In this embodiment, the encapsulation barrier stack comprises a base substrate 201 and a multilayer film 212. The base substrate 201 is laminated with the multilayer film 212 comprising barrier layer 203 and two sealing layers 205 sandwiching the barrier layer 203. Pinhole defects 207 in the barrier layer 203 are sealed by the nanoparticulate material of the sealing layer. The OLED is arranged directly on the multilayer film 212, and encapsulated under a glass cover 210. Rim adhesive 209 serves to adhere the glass cover 210 to the encapsulation barrier stack, thereby forming an encapsulation around the OLED.

Figure 2B:
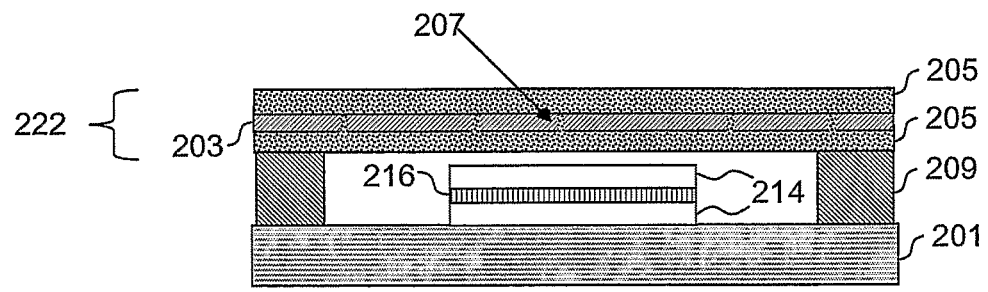

FIG. 2B shows another embodiment in which the encapsulation barrier stack of the invention is used as a cover substrate. The substrate 201 is not laminated by the encapsulation barrier stack (although it may be laminated if desired). In place of the glass cover is the encapsulation barrier stack comprising rigid multilayer film 222 (without a substrate). The multilayer film similarly comprises barrier layer 203 sandwiched between sealing layers 205, and its defects 207 are filled with the nanoparticulate material. The OLED is encapsulated underneath the multilayer film, meaning that in order for the light emitted by the OLED to be clearly seen, the multilayer film 222 should be sufficiently transparent. The multilayer film 222 is attached to the base substrate by means of rim adhesive 209. when implementing rim sealing as shown in FIG. 2A or FIG. 2B, the width of the rim adhesive is typically in the millimeter or centimeter scale, which is substantially larger than the thickness of the base substrate or the encapsulation barrier stack. Accordingly, lateral diffusion of water vapour and oxygen through the rim adhesive would in such a case be substantially longer than transverse diffusion through the encapsulated barrier stack.

Figure 2C:
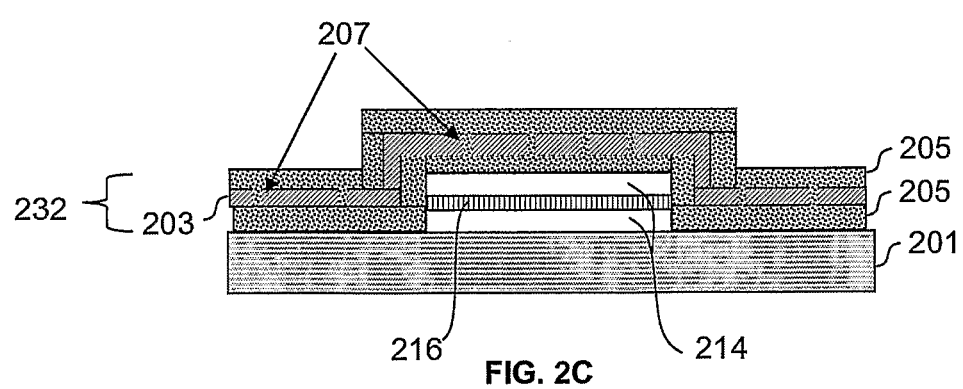

Other than rim sealing as depicted in FIG. 2A and FIG. 2B. In the following figure, thin-film encapsulation comprising the attachment of an encapsulation barrier stack over the OLED, hereinafter referred to as 'proximal encapsulation', is also possible. Proximal encapsulation is in particular suitable for flexible OLED devices. FIG. 2C shows an embodiment in which an OLED comprising electrodes 214 and reactive layer 216 is encapsulated between a flexible base substrate 201 and a flexible encapsulation barrier stack arranged proximally over the OLED comprising multilayer film 232. It will be noted that the multilayer film 232 conforms to the external shape of the OLED device.

Although FIGS. 2A, 2B and 2C depict the encapsulation of an OLED, the encapsulation barrier stack of the present invention is by no means limited to such an application. It will be understood by the skilled person the any article can be encapsulated in place of an OLED, including pharmaceutical drugs, jewelry, reactive metals, electronic components, and food substances, for example.

Figure 3:
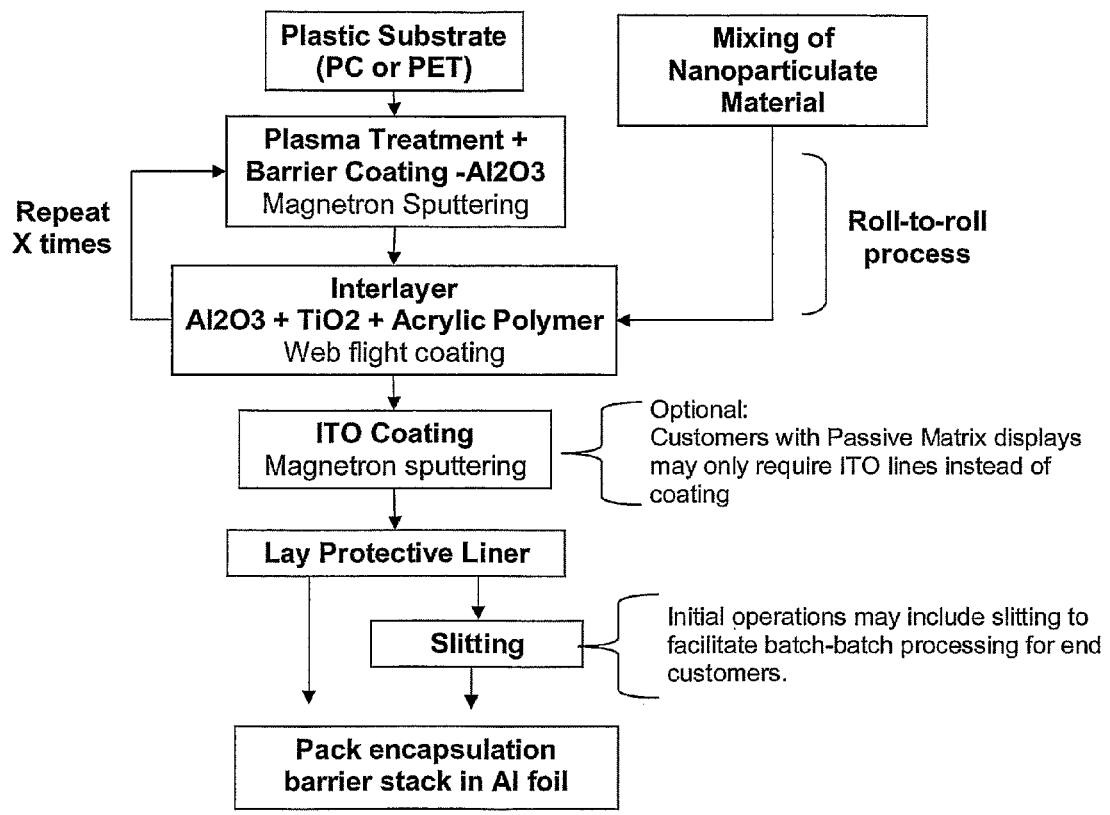
FIG. 3 shows a process flow diagram for fabricating an encapsulation barrier stack.

The general scheme of fabrication of the encapsulation barrier stack according to the invention is shown in FIG. 3. A polycarbonate or PET substrate is provided for forming the encapsulation barrier stack. The substrate is plasma treated and coated with alumina barrier material via magnetron sputtering, thereby forming a barrier layer. Concurrently, a sealing solution comprising alumina and $TiO_2$ nanoparticles is mixed with an acrylic acid monomer solution, thereby forming a sealing solution. The sealing solution is web flight coated onto the barrier layer, for example, via a roll-to-roll process. The coating of barrier layer and sealing layer is repeated for a predetermined number of times to obtain a multilayer film with a desired barrier property. For example, a multilayer film comprising 5 paired layers will require the magnetron sputtering and web flight coating to be repeated 5 times to form 5 paired layer. It is to be noted that it is also possible, in other embodiments, to form an initial coat of sealing layer over the substrate. The sealing layer acts as a planarising material which smoothens the surface of the substrate thereby covering defects on the substrate which could provide pathways for the infiltration of moisture/oxygen.

After the multilayer film is formed, ITO is magnetron sputtered over the multilayer film to form an ITO coating. If the encapsulation barrier stack is to be used in Passive Matrix displays, only ITO lines are required instead of a complete coat of IOT. A protective liner is subsequently formed on the ITO coating. Any suitable material may be used, depending on the intended purpose, e.g. scratch resistant films or glare reduction films, such as MgF/LiF films. After forming the protective film, the encapsulation barrier stack is packed in aluminium foil packaging or slit into predetermined dimensions for assembly with other components.

Specific examples will now be described to illustrate the fabrication process as described above as well as the barrier performance of fabricated encapsulation barrier stacks.

Example 1

Fabrication and Characterisation of Encapsulation Barrier Stacks With Sealing Layer Comprising Metal Oxide Nanoparticles a) Synthesis of Encapsulation Barrier Stacks A, B and C As an illustrative example, three different encapsulation barrier stacks each comprising different nanoparticles in the sealing layer were fabricated. Each of the encapsulation barrier stacks were made according to the following specification:

Stack A
1. Base substrate—Polycarbonate film (188 μm thick)
2. Planarizing layer—Plain acrylic polymer
3. First Barrier layer—ITO (indium tin oxide)
4. Sealing layer—aluminium oxide nanoparticle
5. Second barrier layer—ITO Stack B
1. Base substrate—Polycarbonate film (188 μm thick)
2. Planarizing layer—Plain acrylic polymer
3. First Barrier layer—ITO
4. Sealing layer—titanium oxide nanoparticle
5. Second barrier layer—ITO Stack C
1. Base polymer Substrate—Polycarbonate film (188 μm thick)
2. Planarizing layer—Plain acrylic polymer
3. First Barrier layer—ITO
4. Sealing layer—Aluminium oxide and Titanium oxide nanoparticle
5. Second barrier layer—ITO For comparison, a conventional barrier stack, Stack D, comprising a conventional multi-layer stack structure, was fabricated. Stack D comprised the following stack structure:

Stack D
1. Base substrate—Polycarbonate film (188 μm thick)
2. Planarising layer—Plain acrylic polymer
3. First Barrier layer—ITO
4. Second Planarising layer—Plain acrylic polymer
5. Second Barrier layer—ITO Step (i): Surface Preparation of Substrate Polycarbonate substrates are transparent and can be cut into preferred dimensions. Pneumatically operated hollow die punch-cutting equipment or any conventional slitting machine can be used to slit the polycarbonate substrates into the specified or required dimensions.

The substrates are rinsed with isopropyl alcohol (IPA) and blow-dried with nitrogen to remove macro-scale adsorbed particles on the surface. After nitrogen blow-dry, the substrates are placed in the vacuum oven at a pressure of $10^{-1}$ mbar for degassing absorbed moisture or oxygen.

Immediately after the degassing process, the substrates are transferred to the plasma treatment chamber (e.g. ULVAC SOLCIET Cluster Tool). RF argon plasma is used to bombard the surface of the barrier film with low energy ions in order to remove surface contaminants. The base pressure in the chamber was maintained below $4 \times 10^{-6}$ mbar. The argon flow rate is 70 sccm. The RF power is set at 200 W and an optimal treatment time usually 5 to 8 eight minutes is used depending on the surface condition.

After cleaning of the base substrate was carried out, plain acrylic polymer was spin coated onto the polycarbonate substrates to form an interface planarising layer.

Step (ii): Metal Oxide Barrier Layer Coating

Indium tin oxide barrier layers were prepared by unbalanced magnetron sputtering techniques as follows. Sputtering was used to deposit the metal oxide barrier layer onto the planarising layer. Unbalanced magnetron sputtering technique was used to form high density oxide barrier films. In this sputtering technique, a metal layer of typically a few mono-layers will be deposited from an unbalanced magnetron, and then oxygen will be introduced to the system to create oxygen plasma, directed towards the substrate to provide argon and oxygen ion bombardment for a high packing-density oxide film. Plasma helps to increase the reactivity of the oxygen directed onto the growing film surface and provides for more desirable rheology. In order to deposit dense films without introducing excessive intrinsic stresses, a high flux (greater than 2 mA/cm$^2$) of low energy (~25 eV) oxygen and argon ions to bombard the growing barrier oxide films.

The continuous feedback control unit is used to control the reactive sputtering processes. The light emitted by the sputtering metal in the intense plasma of the magnetron racetrack is one indicator of the metal sputtering rate and the oxygen partial pressure. This indication can be used to control the process and hence achieve an accurate oxide film stoichiometry. By using a continuous feedback control unit from a plasma emission monitor, reproducible films and desirable barrier properties were obtained.

Step (iii): Sealing Layer Coating

Commercially available nanoparticles (e.g. #44931 Nano-Dur® 99.5% aluminium oxide particles from Nanophase Technologies) were pre-treated with plasma and added to an organic solvent, such as 2-methoxyethanol (2MOE) and ethylene glycol (EG) for dispersion in the ratio of 1:1 2MOE to EG. Propylene glycon monomethyl ether or Ethyl Acetate or Methyl Isobutyl Ketone, Methyl Ethyl, 2 MOE or any mixture of solvents or wetting additive agents can be used as well. Alternatively, commercially available nanoparticle dispersions such as aluminium oxide, zinc oxide, or titanium oxide dispersed in Hexane diol diacrylate, Isobornyl acrylate, Tripropylene glycol diacrylate can be used (e.g. a colloidal dispersion of 45 nm APS aluminum oxide dry powder, NanoDur® X1130PMA, 50% dispersed in 1,2-Propanediol monomethyl ether acetate from Nanophase Technologies).

A polymerizable group compound like commercially available UV curable acrylate monomers (Addision Clear Wave—HC-5607) is added to the nanoparticle mixture to form a sealing solution. The polymer coating weight may be between the amount of 30% to 50%. For example, the total concentration of nanoparticles in the polymer may at 66% by weight of the sealing solution, while polymer coating weight is at about 34% by weight of the sealing solution.

The synthesis was undertaken under inert gas environment. The set of experiments were carried out with different mixture of nanoparticles in acrylic polymer solutions and spin coated onto the plain polymer substrate (above FIG. 5).

Each of the samples A, B and C were made according to the general steps (i), (ii) and (iii) using different constituents as explained in the following.

For sample encapsulation barrier stack A, 30 ml of UV curable acrylate monomer with a coating weight of about 50% of the sealing solution was added to 15 ml of a dispersion of aluminium oxide in tripropylene glycol diacrylate (35% weight), obtainable from Nanodur of Nanophase Technologies. 5 ml of an organic solvent of 2-MOE and EG (1:1) ratio was added to the mixture. Sonification of the mixture was then carried out for about 1 hour prior to deposition onto a barrier oxide layer.

For sample encapsulation barrier stack B, 30 ml of UV curable acrylate monomer with a coating weight of about 50% of the sealing solution was added to 10 ml of titanium (IV) oxide dispersed in isopropanol 40% by weight, obtainable from Nanodur of Nanophase Technologies. 10 ml of an organic solvent of 2-MOE and EG (1:1) ratio was added to the mixture. Sonification of the mixture was then carried for about 1 hour prior to deposition onto a barrier oxide layer.

For sample encapsulation barrier stack C, 30 ml of UV curable acrylate monomer with a coating weight of about 50% by weight of the sealing solution was added to (a) 7.5 ml of dispersed aluminium oxide in tripropylene glycol diacrylate (35% weight), obtainable from Nanodur of Nanophase Technologies, and (b) 5 ml of Titanium (IV) oxide dispersed in Isoproanal with 40% weight with 2 MOE and Ethylene glycol (1:1 ratio). Sonification of the mixture was then carried for about 1 hour prior to deposition onto a barrier oxide layer.

The formation of the sealing layer via spin coating was undertaken in a nitrogen atmosphere in a glove box. The oxygen and water vapour contents were reduced to less than 1 ppm level in the glove box.

Characterisation of Encapsulation Barrier Stacks A, B and C

After plasma treatment process, the encapsulation barrier stacks are transferred to a vacuum evaporation chamber (thermal evaporation) under vacuum. The barrier stacks are then evaluated for their barrier properties using the calcium sensor described in WO 2005/095924. Both qualitative evaluation and quantitative evaluation were carried out.

Figure 4:
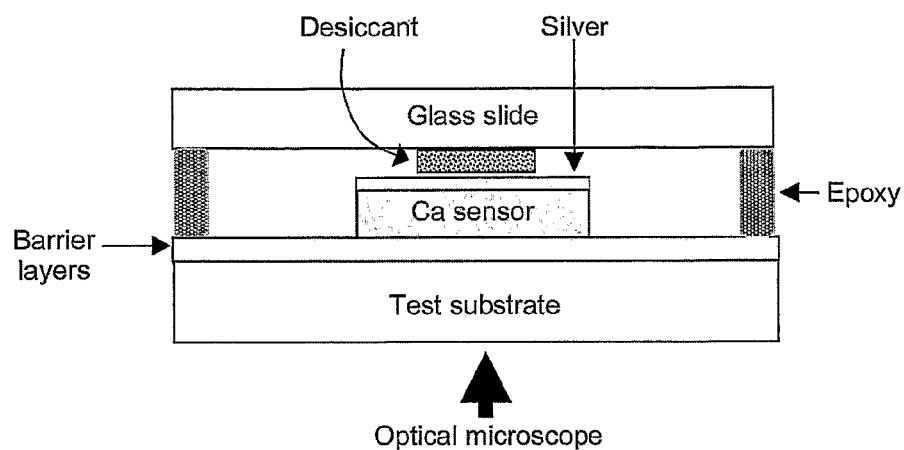
FIG. 4 and FIG. 5 shows a setup for carrying out an investigation of the barrier properties of fabricated encapsulation barrier stacks using a calcium sensor.

In qualitative evaluation, a test cell as shown in FIG. 4 is formed using the fabricated encapsulation barrier stacks. Briefly, two metal tracks with dimensions of 2 cm by 2 cm are fabricated. A sensing element having dimensions of 1 cm length, 2 cm width and 150 nm thickness is formed in between the two electrodes. The measured resistivity of the sensing element is 0.37 Ω-cm. After the deposition process, a load lock system is used to transfer the sample to a glove box under dry nitrogen at atmospheric pressure. After the calcium deposition, a 100 nm silver protection layer was deposited for the qualitative analysis.

Figure 5:
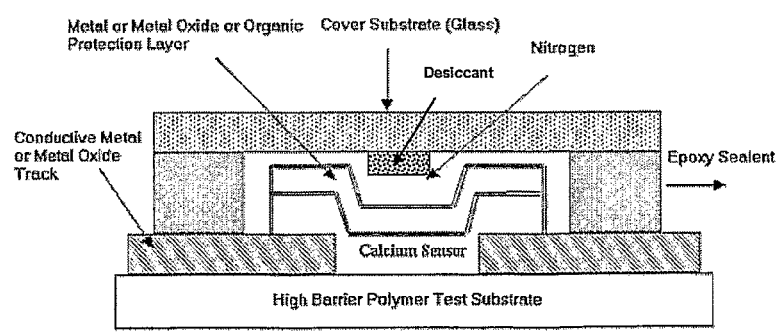

In the case of the quantitative resistance measurement, a test cell as shown in FIG. 5 is formed using the fabricated encapsulation barrier stacks. 300 nm of silver was used for the conductive track, 150 nm calcium was used as the sensor and 150 nm lithium fluoride was used as a protection layer. After the deposition processes, a UV curable epoxy was applied on the rim of the substrate and then the whole substrate was sealed with a 35 mm×35 mm glass slide. Desiccants were attached to the 35 mm×35 mm cover glass slide for absorbing any water vapour present due to out gassing or permeation through the epoxy sealing. A load lock system was used for the entire process and the test cells were encapsulated in the glove box under dry nitrogen at atmospheric pressure. To accelerate the permeation tests, the samples were placed into a humidity chamber at constant temperature and humidity of 80° C. & 90% RH respectively. These were viewed optically at regular intervals for a qualitative degradation test and analysis of the defects, and measured electrically for the quantitative analysis of the degradation. The calcium test cell's conductive track terminals are connected to a constant current source (Keithey source meter), which is interfaced with a computer. Resistance of the calcium sensor/silver track is monitored every second and plotted automatically by the computer using lab view software. A Dynamic Signal Analyzer with a FFT analysis is used to take the noise spectrum measurement automatically at periodic intervals of one second.

The calcium degradation test provides qualitative visual information on defects such as pinholes cracks and nanopores, because the permeated water vapors diffuse through the defects of the substrate and its barrier layer(s) and react with the calcium sensor to form distinguishable patches on the calcium sensing element. Micro-pores and sub-micron sized pores such as pinholes and cracks in a transparent coating are very difficult to discern or to study even by sophisticated surface microscopy techniques (e.g. SEM). In the present experiment, the colour contrast between oxidized and non-oxidized calcium was used for qualitative analysis.

The degradation was monitored using optical microscopy. The images were taken at intervals of typically several hours. From the images the calcium-corroded spots could be directly linked to defects of the barrier films. Further, growth dynamics of the calcium corrosion could provide qualitative information of barrier properties.

Figure 6:
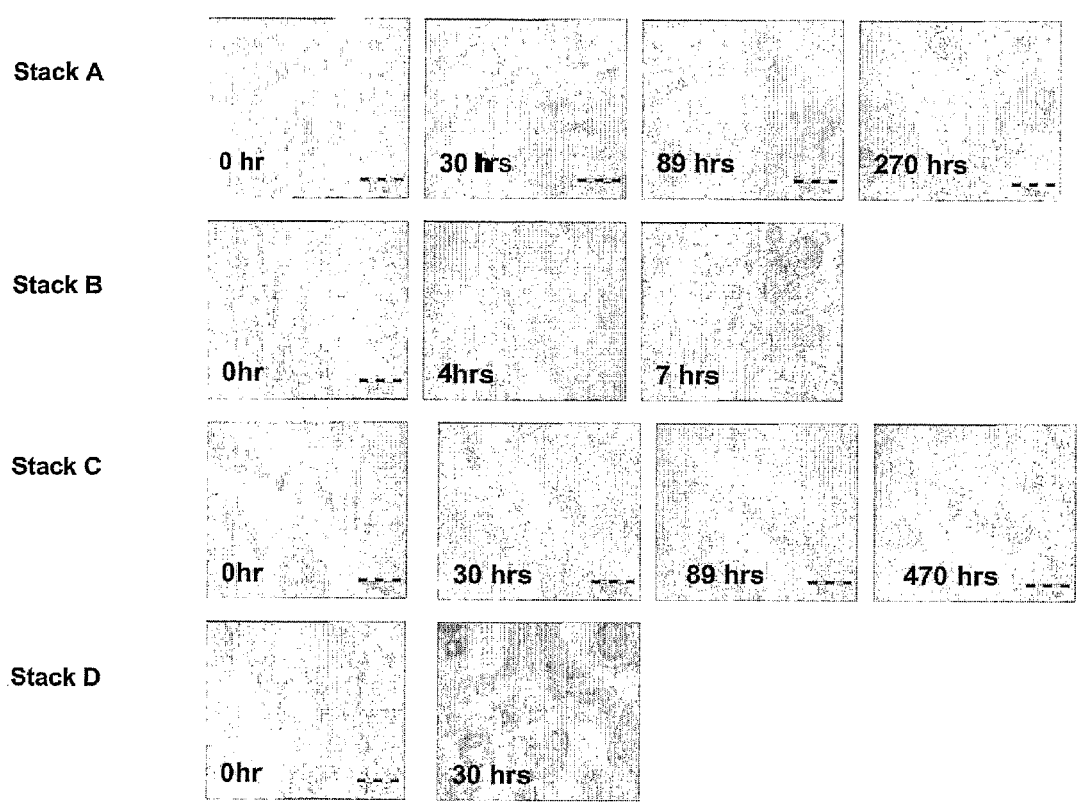
FIG. 6 shows the optical images of 4 different encapsulation barrier stacks, Stacks A, B, C, and D, after exposure to moisture.

The images in FIG. 6 highlight the nature of the defects exhibited on A B, C films that have been tested and the barrier structure is shown in FIG. 6. The degradation images in FIG. 6 show that the barrier stacks A and C have significantly better barrier properties as compared to conventional barrier stacks as exemplified by barrier stack D. Calcium sensor degradation in barrier stack A commenced at 80 hours and the entire calcium degraded by 270 hours. Calcium sensor degradation in barrier stack C did no show any significant degradation until after 470 hours.

Figure 7:
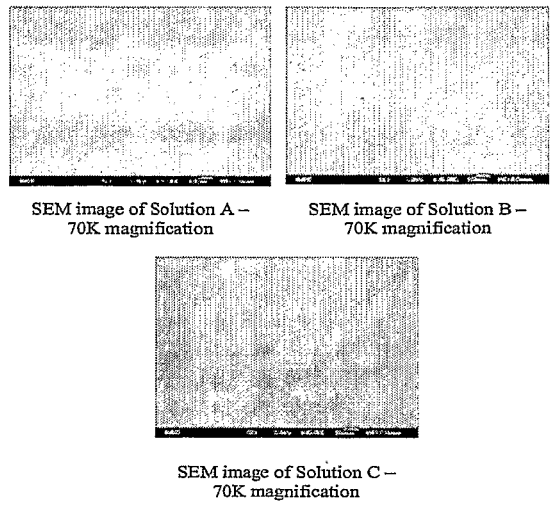
FIG. 7 shows 70× magnification SEM images of 3 encapsulation barrier Stacks A to C made according to the invention.

FIG. 7 shows scanning electron microscopy (SEM) images of barrier stacks A, B & C immediately after fabrication. The surfaces of these three barrier Stacks are smooth and no agglomeration of nanoparticles is observed. These images confirm that the dispersion of the nanoparticles in the sealing layer is uniform, so that the barrier stack is consequently transparent. The further investigation on water vapor transport properties were carried out with permeation measurement system and discussed with next section.

Figure 8:
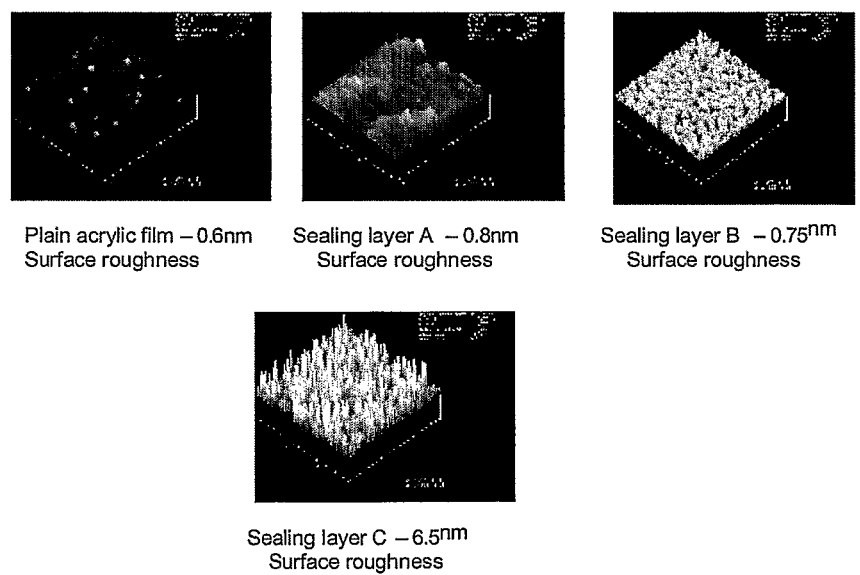
FIG. 8 shows the morphology of the 3 encapsulation barrier Stacks A to C made according to the invention.

FIG. 8 shows images of the surface of the sealing layers as studied with SEM and AFM. The surface properties were compared with of that of plain acrylic polymer coatings. The AFM picture shows that the uniform dispersion of nanoparticles in solution A, B and C was achieved. The surface roughness measured for barrier stacks A and B films are well within 0.75 nm at 1 µm to 10 µm scans and comparable with plain acrylic polymer films. However, for barrier stack C, the surface is relatively rough (6.5 nm). Roughness may be advantageously used to improve the adhesion between the barrier layer and the substrate.

Figure 9:
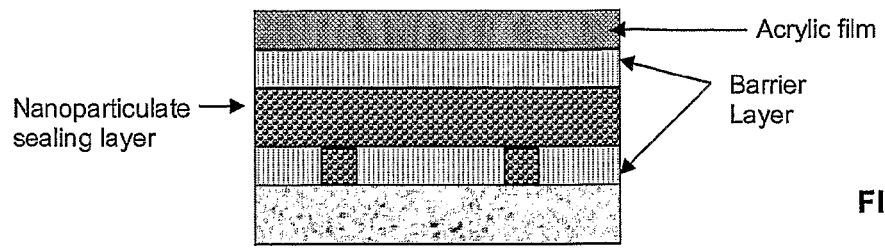
FIG. 9 shows an embodiment of the encapsulation barrier stack of the invention comprising a capping acrylic film. The encapsulation barrier stack was used for quantitative analysis.

A test encapsulation barrier stack having the structure shown in FIG. 9 was fabricated to carry out a quantitative analysis of the encapsulation barrier stack samples fabricated in accordance with the above. An encapsulation barrier stack was fabricated with two ITO barrier layers were fabricated by magnetron sputtering method and one sealing layer (comprising aluminium oxide nanoparticles) was used to seal the ITO defects. The outermost terminating layer is plain acrylic film which is normally used for WVTR measurement purpose. In principle, only one ITO barrier layer's defects were sealed. In this embodiment, the sealing layer comprises $Al_2O_3$ nanoparticles with sizes of 20 nm to 40 nm.

Figure 10:
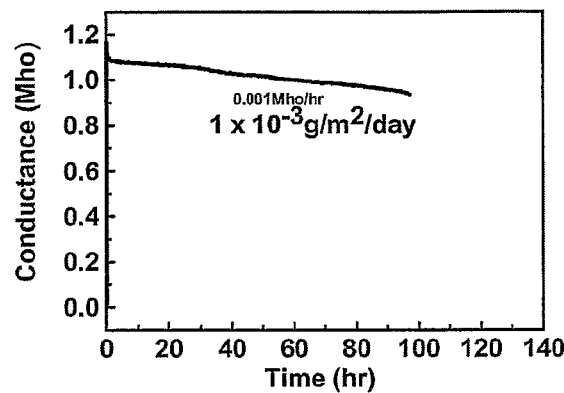
FIG. 10 shows a graph of Electrical Conductance vs Time for the encapsulation barrier stack shown in FIG. 9.
Figure 11:
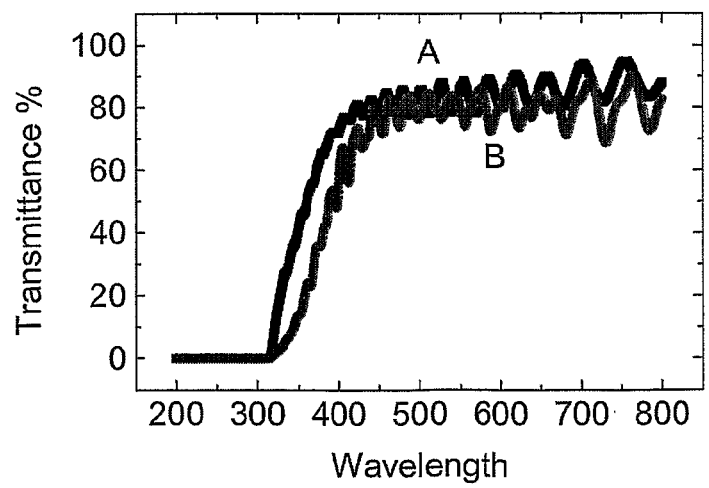
FIG. 11 shows a graph of Transmittance vs Wavelength for the encapsulation barrier stack shown in FIG. 9.

The plot of calcium conductance against time is shown in FIG. 10 for the encapsulation barrier stack. The corresponding change in calcium (mol) can be derived from the graph. The water vapour transmission rate of the encapsulation barrier stack comprising one barrier layer and one sealing layer is determined to be $1 \times 10^{-3}$ g/m²/day at 80° C. & 90% relative humidity. In contrast, conventional multi-layer stacks with two barriers SiN layer and plain acrylic interlayer showed performance of only about $10^{-1}$ g/m²/day level at 70° C. & 90% relative humidity condition.

Therefore, these results demonstrate that by sealing off the defects of one barrier layer with a nanoparticulate sealing layer, the barrier performance is improved up to two orders in higher magnitude as compared to the plain acrylic film based multi-layer substrate. If the defects in three or more barrier layers are sealed using two or more sealing layers comprising reactive nanoparticles, the water vapour barrier performance can be less than $10^{-5}$ g/m²/day, or even less than $10^{-6}$ g/m²/day.

The single-layered encapsulation barrier stack comprising polycarbonate (188 µm)/ITO/Nanostructured sealing layer with aluminium and titanium nanoparticle and the double-layered encapsulation barrier stack with PC/ITO/sealing layer/ITO/sealing layer was fabricated. The optical properties measured the spectral transmission in the UV and visible region of the spectrum was measured with UV-Vis spectrometer. It shows that the light transmittance of double stack is 82% and single stack is about 85%. The reduction of transmission is due to ITO film properties and nature.

Example 2

Fabrication and Characterisation of Encapsulation Barrier Stacks with Sealing Layer Comprising Carbon Nanotubes The following encapsulation barrier stacks with differing carbon nanotube compositions in the sealing layers were prepared:

Stack E
1. Polycarbonate (188 µm) as base substrate
2. ITO as barrier layer
3. Nanostructured sealing layer with MCNTs at 0.006% concentration as sealing layer Stack F
1. Polycarbonate (188 µm) as base substrate
2. ITO as barrier layer
3. Nanostructured sealing layer with MCNTs at 0.05% concentration as sealing layer Pre-treated 10 nm diameter multiwalled nanotubes (hereinafter 'MCNT') were first added to a solution mixture of 2-methoxyethanol (2MOE) and ethylene glycol (EG) for dispersion. The ratio of 2MOE to EG is 1:1. The nanotubes were dispersed uniformly into the acrylic polymer via sonification. The synthesis was undertaken under inert gas environment.

Stack E comprises MCNT in the amount of 0.006% by weight, and solution F comprises MCNT in the amount of 0.05% by weight. The sealing layers were 2 µm thick. The synthesis and fabrication of thin films of sealing layers were under taken in the glove box which has partial pressure of nitrogen. The oxygen and water vapour contents were controlled with less than 1 ppm level in the glove box.

Stack D as fabricated in Example 1 was used for the comparison of the characteristics of the barrier stacks E and F.

Figure 12:
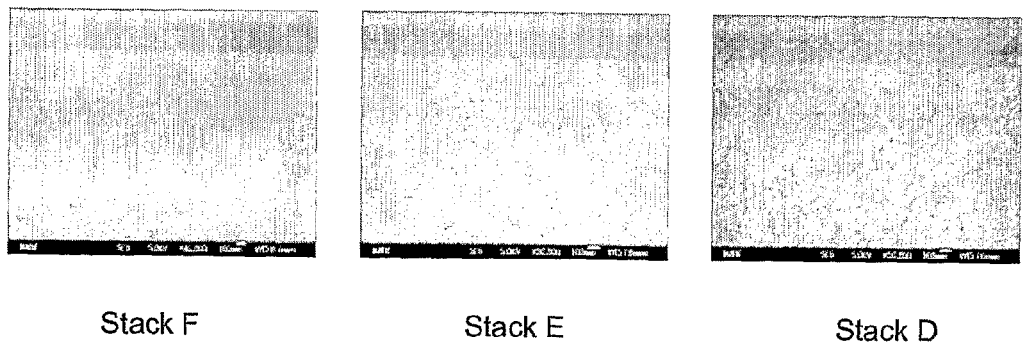
FIG. 12 shows the scanning electron microscopy (SEM) images of barrier stacks D, E and F.

The stacks comprising MCNT in the sealing layer were compared with Stack D. FIG. 12 shows scanning electron microscopy (SEM) images of Stacks D, E & F films. The surfaces of E and F sealing films are smooth and no agglomeration of MCNT is noticed. These results show that the dispersion of MCNT in the sealing layer is uniform and that the films are transparent. Further investigation on water vapour transport properties and optical properties were carried out with permeation measurement system and spectrometer and discussed below.

The optical properties of each barrier stack were measured with spectral transmission in the UV and visible region of the spectrum with UV-Vis Spectrometry.

Figure 13:
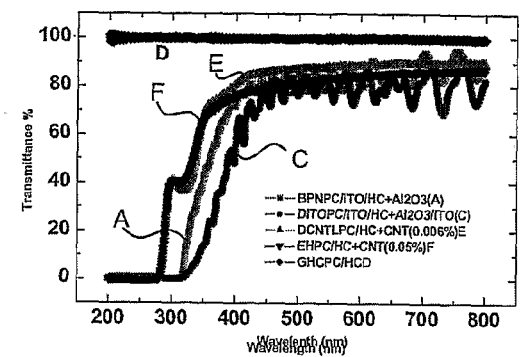
FIG. 13 shows the graph of transmittance vs. wavelength for encapsulation barrier stacks A, C, D, E and F.

As can be seen from FIG. 13, conventional acrylic film coated substrate (D) has very high transmission with 99%. However, it does not block UV light. It shows that the light transmittance of double stack is 82% and single stacks are about 85%. The CNT contained encapsulation barrier stack E & F shows transparency about 85%. The reduction of double stack transmission is due to ITO film properties and nature. The figure also shows that the nanoparticle dispersion of the films A, C, E & F are uniform, have no agglomeration and therefore, the light transmission is in the range of 82 to 89%.

Figure 14:
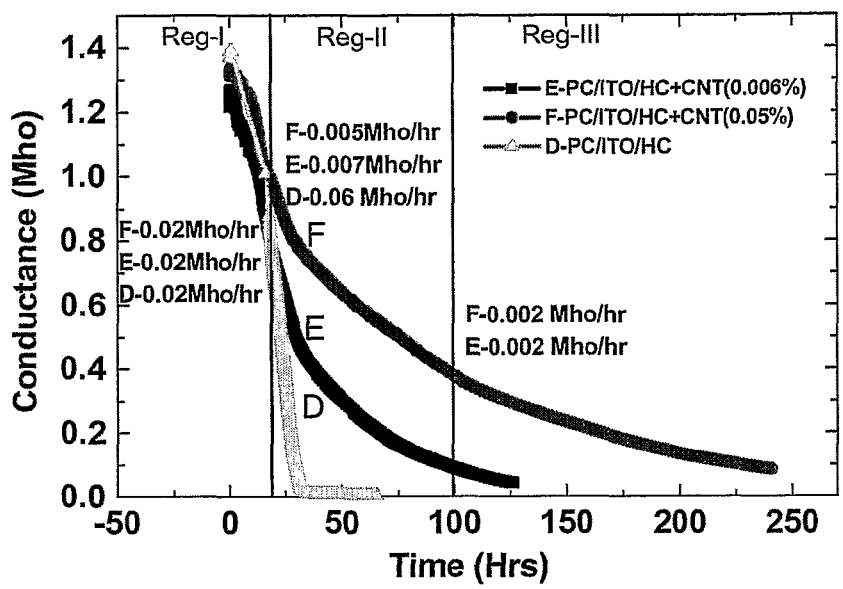
FIG. 14 shows the graph of Conductance vs. Time for encapsulation barrier stacks D, E and F.

The quantitative calcium degradation results of FIG. 14 show that the barrier stack E and barrier stack F shows significantly better overall barrier properties than conventional barrier stack D. The initial calcium sensor degradation/water vapour desorption rates similar for all encapsulation barrier stacks E, F and D at 15 hours and the measured WVTR is 0.03 g/m²/day level. However, after reaching 20 hours, the steady state water vapour transmission rates of D is 0.1 g/m²/day and the entire calcium was degraded before 30 hours. The CNT-containing encapsulation barrier stacks E and F shows the rates of 0.01 g/m²/day and 0.009 g/m²/day level respectively. After reaching 100 hrs, the barrier stacks E and F shows a significant improvement in barrier properties and the WVTR rates was 0.003 g/m²/day.

Without wishing to be bound by theory, it is thought that in barrier stacks E and F, water vapour is drawn into open-ended nanotubes by capillary suction after 30 hrs of exposure. It is postulated that the time taken for the water molecule to diffuse into the carbon nanotubes is longer as compared to normal modes of diffusion and therefore, the initial water vapour desorption was very high. The initial desorption/permeability results of this invention demonstrated that the probability of sealing the defects of the barrier layer by CNTs is relatively low. This may be due to the concentration (0.05%) of CNT used in the interlayer as compared to the nanoparticles concentration (30% to 60%).

To quantify the adhesion properties of an encapsulation barrier stack according to the invention, standard peel tests were performed using an Instron test system. The following encapsulation barrier stacks were tested upon:

Stack G
1. Polycarbonate as base substrate
2. ITO as barrier layer
3. sealing layer comprising aluminium oxide particles ($Al_2O_3$ (20% by weight) dispersed in acrylic film Stack H
1. Polycarbonate as base substrate
4. ITO as barrier layer
5. sealing layer comprising aluminium oxide particles ($Al_2O_3$ (15% by weight) dispersed acrylic film Conventional barrier stack D as fabricated in Example 1 was again used for comparison. The 2 μm thick sealing layers were deposited onto ITO coated polycarbonate test substrates and these substrates. They were cut into the pieces of 10 cm length and 1 cm width and the UV curable epoxy (Three Bond) were applied to a 3 cm long and 1 cm wide area at one end of the sample similar to the ASTM requirements. Surface preparation involves the argon plasma cleaning of the above substrates before the application of epoxy.

Figure 15:
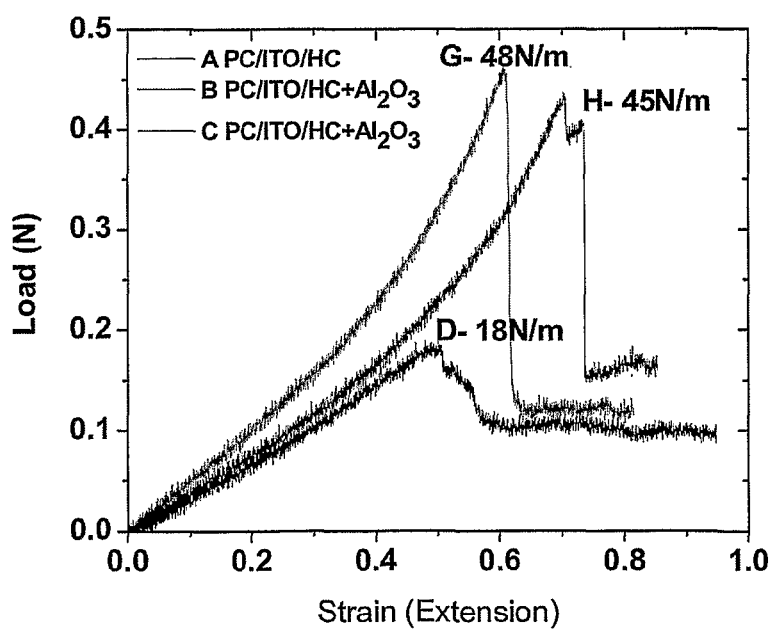
FIG. 15 shows the Load Strain performance curve for barrier stacks D, G and H.

The Load/Strain curve for sample barrier stacks D, G and H were plotted and the results of the test can be seen in FIG. 15. The barrier stacks D with the plain conventional acrylic film on ITO surface, the initial interfacial failure occurred at the interface between the acrylic film and ITO at 18 N/m and levelling off to steady-state peel strength of about 12 N/m. Therefore the adhesion strength of conventional acrylic polymer onto barrier oxide layer is only 18 N/m. When the barrier stacks G and H were tested, the initial interfacial failure occurred at the interface between the nanostructured organic sealing layer and ITO at 45 N/m for barrier stacks H and 48 N/m for barrier stacks G and levelling off to steady-state peel strength of about 14-15 N/m for barrier stacks H and G. Therefore the adhesion strength of nano-structured sealing barrier stacks (G & H) onto barrier oxide layer is 12-15 N/m. This result demonstrates clearly that the adhesion between barrier oxide layer and nanostructured sealing layer is significantly improved due to the sealing of the barrier layer's pinholes and defects.

Although this invention has been described in terms of illustrative embodiments, it has to be understood that numerous variations and modifications may be made, without departing from the spirit and scope of this invention as set out in the following claims.

What is claimed is:

1. An encapsulation barrier stack for encapsulating at least one of a moisture and oxygen sensitive article, comprising:
a multilayer film to be arranged on a substrate, the multilayer film having at least one barrier layer having at least one of low moisture and low oxygen permeability, and
at least one sealing layer arranged to be in contact with a surface of the at least one barrier layer, for plugging at least one defect present in the barrier layer, wherein the at least one sealing layer comprises reactive nanoparticles interacting by way of chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer, wherein the nanoparticles have different at least one of shapes and sizes for controlling the sealing and plugging of the at least one defect, wherein the barrier layer comprises a material selected from indium tin oxide (ITO), TiAlN, $SiO_2$, SiC, $Si_3N_4$, $TiO_2$, $HfO_2$, $Y_2O_3$, $Ta_2O_5$, and $Al_2O_3$ and wherein a permeation rate of the barrier stack having the at least one sealing layer on the surface of the at least one barrier layer is $10^{-3}$ g/m²/day or less.

2. The barrier stack of claim 1, wherein the nanoparticles comprise a material selected from the group consisting of metals and metal oxides.

3. The barrier stack of claim 2, wherein the nanoparticles comprise a metal selected from the group consisting of Al, Ti, Mg, Ba and Ca.

4. The barrier stack of claim 2, wherein the nanoparticles comprise a metal oxide selected from the group consisting of $TiO_2$, $Al_2O_3$, $ZrO_2$, ZnO, BaO, SrO, CaO and MgO, $VO_2$, $CrO_2$, $MoO_2$, and $LiMn_2O_4$ or a transparent conductive oxide selected from the group consisting of cadmium stannate ($Cd_2SnO_4$), cadmium indate ($CdIn_2O_4$), zinc stannate ($Zn_2SnO_4$ and $ZnSnO_3$), and zinc indium oxide ($Zn_2In_2O_5$).

5. The barrier stack of claim 1, wherein the nanoparticles further comprise carbon nanotubes.

6. The barrier stack of claim 5, wherein the amount of carbon nanotubes present is about 0.01% to about 10% of the total weight of nanoparticles present in the sealing layer.

7. The barrier stack of claim 1, wherein the sealing layer comprises carbon nanotubes and metal oxide nanoparticles, the quantity of metal oxide nanoparticles present being between 500 to 15000 times (by weight) the quantity of carbon nanotubes present.

8. The barrier stack of claim 1, further comprising inert nanoparticles obstructing the permeation of the at least one of moisture and oxygen through the at least one defect present in the barrier layer.

9. The barrier stack of claim 8, wherein the inert nanoparticles comprise a material selected from the group consisting of gold, copper, silver, platinum, silica, wollastonite, mullite, monmorillonite, silicate glass, fluorosilicate glass, fluoroborosilicate glass, aluminosilicate glass, calcium silicate glass, calcium aluminum silicate glass, calcium aluminum fluorosilicate glass, titanium carbide, zirconium carbide, zirconium nitride, silicon carbide, or silicon nitride, metal sulfides, and a mixture or combination thereof.

10. The barrier stack of claim 1, wherein the size of the nanoparticles is smaller than the average diameter of defects present in the at least one barrier layer.

11. The barrier stack of claim 1, wherein when the at least one of the oxygen and moisture sensitive article comprises an electroluminescent electronic component, the average size of the nanoparticles is less than one-half the characteristic wavelength of light produced by the electroluminescent electronic component.

12. The barrier stack of claim 1, wherein the sealing layer further comprises a polymeric binder.

13. The barrier stack of claim 1, further comprising a substrate for supporting the multilayer film.

14. The barrier stack of claim 13, wherein the multilayer film is orientated such that the sealing layer is arranged on the substrate.

15. The barrier stack of claim 13, wherein the substrate comprises a material selected from polyacetate, polypropylene, polyimide, cellophane, poly(l-trimethylsilyl-1-propyne, poly(4-methyl-2-pentyne), polyimide, polycarbonate, polyethylene, polyethersulfone, epoxy resins, polyethylene terepthalate, polystyrene, polyurethane, polyacrylate, and polydimethylphenylene oxide, styrene-divinylbenzene copolymers, polyvinylidene fluoride (PVDF), nylon, nitrocellulose, cellulose, glass, indium tin oxide, nano-clays, silicones, polydimethylsiloxanes, biscyclopentadienyl iron, and polyphosphazenes.

16. The barrier stack of claim 13, further comprising a planarising layer interposed between the substrate and the multilayer film.

17. The barrier stack of claim 1, wherein the multilayer film is arranged on one surface of the substrate or wherein each multilayer film is arranged on each opposing surface of the substrate.

18. The barrier stack of claim 1, further comprising a terminal layer for protecting the multilayer film.

19. The barrier stack of claim 18, wherein the terminal layer comprises an acrylic film.

20. The barrier stack of claim 19, wherein the acrylic film comprises distributed therein at least one of LiF and $MgF_2$ particles.

21. The encapsulation barrier stack of claim 1, wherein the chemical reaction is at least one of hydrolysis or oxidation.

22. An electronic device comprising:
an active component that is sensitive to at least one of moisture and oxygen, the active component being arranged within an encapsulation barrier stack for encapsulating at least one of a moisture and oxygen sensitive article, the encapsulation barrier stack comprising:
a multilayer film to be arranged on a substrate, the multilayer film having
at least one barrier layer having at least one of low moisture and low oxygen permeability, and
at least one sealing layer arranged to be in contact with a surface of the at least one barrier layer, for plugging at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer, wherein the nanoparticles have different at least one of shapes and sizes for controlling the sealing and plugging of the at least one defect, wherein the barrier layer comprises a material selected from indium tin oxide (ITO), TiAlN, $SiO_2$, SiC, $Si_3N_4$, $TiO_2$, $HfO_2$, $Y_2O_3$, $Ta_2O_5$, and $Al_2O_3$ and wherein a permeation rate of the barrier stack having the at least one sealing layer on the surface of the at least one barrier layer is $10^{-3}$ g/m$^2$/day or less.

23. The electronic device of claim 22, wherein the encapsulation barrier stack forms a base substrate for supporting the reactive component.

24. The electronic device of claim 22, wherein the encapsulation barrier stack further comprises a covering layer arranged proximally over the active component to form a proximal encapsulation, the reactive component being sandwiched between the covering layer and the encapsulation barrier stack.

25. The electronic device of claim 24, wherein the shape of the covering layer conforms to the external shape of the reactive component.

26. The electronic device of claim 22, wherein the encapsulation further comprises a cover substrate attached to the base substrate by means of an adhesive layer, the adhesive layer being arranged at least substantially along the edge of the cover substrate for forming a rim-sealed enclosure around the reactive component.

27. The electronic device of claim 22, wherein the active component is arranged on a base substrate, and the encapsulation barrier stack forms an encapsulation layer over the reactive component that seals the reactive component against the base substrate.

28. The electronic device of claim 22, wherein the reactive component is selected from the group consisting of an Organic Light Emitting Device (OLED), charged-coupled device (CCD), and micro-electro-mechanical sensors (MEMS).

29. A method to manufacture an encapsulation barrier stack, comprising:
forming at least one barrier layer; and
forming at least one sealing layer on a surface of the at least one barrier layer, wherein forming the at least one sealing layer comprises conformal deposition of the at least one sealing layer over the at least one barrier layer under vacuum or in an inert gas environment, wherein the encapsulation barrier stack is for encapsulating at least one of a moisture and oxygen sensitive article, the at least one barrier layer having at least one of low moisture and low oxygen permeability, wherein the at least one sealing layer is arranged to be in contact with the surface of the at least one barrier layer to plug at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer and wherein the nanoparticles have different at least one of shapes and sizes for controlling the sealing and plugging of the at least one defect, wherein the barrier layer comprises a material selected from indium tin oxide (ITO), TiAlN, SiO$_2$, SiC, Si$_3$N$_4$, TiO$_2$, HfO$_2$, Y$_2$O$_3$, Ta$_2$O$_5$ and Al$_2$O$_3$ and wherein a permeation rate of the barrier stack having the at least one sealing layer on the surface of the at least one barrier layer is 10$^{-3}$ g/m$^2$/day or less.

30. The method of claim 29, further comprising providing a substrate for supporting the barrier stack, wherein the at least one sealing layer is first formed on the substrate.

31. The method of claim 30, wherein the substrate comprises at least one of a barrier layer and a polymer substrate.

32. The method of claim 29, wherein the conformal deposition comprises mixing a polymeric binding material with a nanoparticle dispersion comprising nanoparticles dispersed in a solvent for doping the nanoparticle dispersion with the polymeric binding material, to form a sealing mixture, and optionally polymerising the sealing mixture over the at least one barrier layer.

33. The method of claim 29, wherein the nanoparticles are distributed in a sealing solution with a concentration of the nanoparticles of at least 50% by weight of the sealing solution.

34. The method of claim 29, wherein the concentration of the nanoparticles is at least 50% and less than 70% by weight of the sealing solution.

35. An encapsulation barrier stack for encapsulating at least one of a moisture and oxygen sensitive article, comprising: a multilayer film to be arranged on a substrate, the multilayer film comprising at least one barrier layer having at least one of low moisture and low oxygen permeability, and at least one sealing layer arranged to be in contact with a surface of the at least one barrier layer to plug at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer, wherein the sealing layer is formed by conformal deposition, wherein the conformal deposition is selected from the group consisting of chemical vapour deposition, spin coating, screen printing, WebFlight method, tip coating, atomic layer deposition, and pulsed laser deposition, wherein the barrier layer comprises a material selected from indium tin oxide (no), TiAlN, SiO$_2$, SiC, Si$_3$N$_4$, TiO$_2$, HfO$_2$, Y$_2$O$_3$, Ta$_2$O$_5$ and Al$_2$O$_3$ and wherein a permeation rate of the barrier stack having the at least one sealing layer on the surface of the at least one barrier layer is 10$^{-3}$ g/m$^2$/day or less.

36. The barrier stack of claim 35, wherein the amount by weight of the polymeric binder present in the sealing layer is less than the amount by weight of the nanoparticles present in the sealing layer.

37. The barrier stack of claim 36, wherein the polymeric binder is between 30% and 50% of the total weight of the sealing layer.

38. The barrier stack of claim 35, wherein the sealing layer is a nanoparticle sealing layer.

39. A method to manufacture an encapsulation barrier stack, comprising:
provided at least one barrier layer; and
forming at least one sealing layer on a surface of the at least one barrier layer, wherein forming the at least one sealing layer comprises conformal deposition of the at least one sealing layer over the at least one barrier layer under vacuum or in an inert gas environment, the at least one barrier layer having at least one of low moisture and low oxygen permeability, wherein the at least one sealing layer is arranged to be in contact with the surface of the at least one barrier layer to plug at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer, wherein the conformal deposition is selected from the group consisting of chemical vapour deposition, screen printing, WebFlight method, tip coating, atomic layer deposition, and pulsed laser deposition, wherein the barrier layer comprises a material selected from indium tin oxide (ITO), TiAlN, SiO$_2$, SiC, Si$_3$N$_4$, TiO$_2$, HfO$_2$, Y$_2$O$_3$, Ta$_2$O$_5$, and Al$_2$O$_3$ and wherein a permeation rate of the barrier stack having the at least one sealing layer on the surface of the at least one barrier layer is 10$^{-3}$ g/m$^2$/day or less.

40. An encapsulation barrier stack for encapsulating at least one of a moisture and oxygen sensitive article, comprising: a multilayer film to be arranged on a substrate, the multilayer film comprising at least one barrier layer having at least one of low moisture and low oxygen permeability, and at least one sealing layer arranged to be in contact with a surface of the at least one barrier layer, for plugging at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer, wherein a shape of the nanoparticles is used to control sealing of defects in the at least one barrier layer, wherein the defects are structural defects including at least one of pinholes and cracks, wherein the barrier layer comprises a material selected from indium tin oxide (ITO), TiAlN, SiO$_2$, SiC, Si$_3$N$_4$, TiO$_2$, HfO$_2$, Y$_2$O$_3$, Ta$_2$O$_5$ and Al$_2$O$_3$ and wherein a permeation rate of the barrier stack having at least one sealing layer on the surface of the at least one barrier layer is 10$^{-3}$ g/m$^2$/day or less.

41. A method to manufacture an encapsulation barrier stack, comprising:
forming at least one barrier layer; and
forming at least one sealing layer on a surface of the at least one barrier layer, wherein forming the at least one sealing layer comprises conformal deposition of the at least one sealing layer over the at least one barrier layer under vacuum or in an inert gas environment, the at least one barrier layer having at least one of low moisture and low oxygen permeability, wherein the at least one sealing layer is arranged to be in contact with the surface of the at least one barrier layer, to plug at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer plug the at least one defect present in the at least one barrier layer, wherein the forming the at least one sealing layer comprises adding the nanoparticles to an organic solvent, and curing the sealing layer, wherein the barrier layer comprises a material selected from indium tin oxide (ITO), TiAlN, $SiO_2$, SiC, $Si_3N_4$, $TiO_2$, $HfO_2$, $Y_2O_3$, $Ta_2O_5$ and $Al_2O_3$ and wherein a permeation rate of the barrier stack having the at least one sealing layer on the surface of the at least one barrier layer is $10^{-3}$ $g/m^2/day$ or less.

42. An encapsulation barrier stack for encapsulating at least one of a moisture and oxygen sensitive article, comprising: a multilayer film to be arranged on a substrate, the multilayer film comprising at least one barrier layer having at least one of low moisture and low oxygen permeability, and at least one sealing layer arranged to be in contact with a surface of the at least one barrier layer, for entirely plugging at least one defect present in the barrier layer, wherein the at least one sealing layer comprises reactive nanoparticles interacting by way of a chemical reaction with at least one of moisture and oxygen to retard the permeation of the at least one of moisture and oxygen through the at least one defect present in the barrier layer, wherein the nanoparticles present in the at least one sealing layer are distributed in a sealing solution to entirely plug the at least one defect present in the at least one barrier layer, wherein the barrier layer comprises a material selected from indium tin oxide (no), TiAlN, $SiO_2$, SiC, $Si_3N_4$, $TiO_2$, $HfO_2$, $Y_2O_3$, $Ta_2O_5$ and $Al_2O_3$ and wherein a permeation rate of the barrier stack having the at least one sealing layer on the surface of the at least one barrier layer is $10^{-3}$ $g/m^2/day$ or less.

* * * * *